(12) United States Patent
Wang et al.

(10) Patent No.: US 10,475,860 B2
(45) Date of Patent: Nov. 12, 2019

(54) DISPLAY PANEL AND DISPLAY DEVICE

(71) Applicant: SHANGHAI TIANMA MICRO-ELECTRONICS CO., LTD., Shanghai (CN)

(72) Inventors: Lihua Wang, Shanghai (CN); Yang Zeng, Shanghai (CN); Qing Zhang, Shanghai (CN); Kang Yang, Shanghai (CN); Lingxiao Du, Shanghai (CN); Hong Ding, Shanghai (CN); Liang Xie, Shanghai (CN); Huiping Chai, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 65 days.

(21) Appl. No.: 15/799,760

(22) Filed: Oct. 31, 2017

(65) Prior Publication Data

US 2018/0076268 A1 Mar. 15, 2018

(30) Foreign Application Priority Data

Apr. 27, 2017 (CN) .......................... 2017 1 0298770

(51) Int. Cl.
| | |
|---|---|
| *G06K 9/00* | (2006.01) |
| *H01L 27/32* | (2006.01) |
| *H01L 27/144* | (2006.01) |
| *H01L 51/52* | (2006.01) |
| *H01L 51/56* | (2006.01) |

(52) U.S. Cl.
CPC ........ *H01L 27/3227* (2013.01); *G06K 9/0004* (2013.01); *H01L 27/1443* (2013.01); *H01L 27/3246* (2013.01); *H01L 27/3262* (2013.01); *H01L 51/5246* (2013.01);
(Continued)

(58) Field of Classification Search
CPC ..................................................... H01L 27/323
See application file for complete search history.

(56) References Cited

U.S. PATENT DOCUMENTS

| | | | | |
|---|---|---|---|---|
| 2004/0252867 A1* | 12/2004 | Lan | ...................... | G06K 9/0004 382/124 |
| 2017/0091506 A1* | 3/2017 | Sinha | .................... | G06F 1/1643 |

(Continued)

FOREIGN PATENT DOCUMENTS

| | | |
|---|---|---|
| CN | 105575998 A | 5/2016 |
| CN | 105930827 A | 9/2016 |

(Continued)

*Primary Examiner* — Oneal R Mistry
(74) *Attorney, Agent, or Firm* — Alston & Bird LLP

(57) ABSTRACT

This application provides a display panel and a display device. The display panel includes an array substrate, an encapsulation layer and a fingerprint recognition module. The array substrate includes a first substrate and a plurality of light-emitting units on the first substrate. The encapsulation layer is disposed on top of the plurality of light-emitting units. The fingerprint recognition module is disposed on the encapsulation layer and includes at least one fingerprint recognition unit. The projection of the fingerprint recognition unit onto the array substrate is located in the non-light-emitting area of the first substrate. The non-light-emitting area is located between two adjacent light-emitting units.

14 Claims, 18 Drawing Sheets

(52) U.S. Cl.
CPC .......... *H01L 51/5253* (2013.01); *H01L 51/56* (2013.01); *H01L 27/323* (2013.01); *H01L 2227/323* (2013.01)

(56) References Cited

U.S. PATENT DOCUMENTS

2017/0221972 A1* 8/2017 Yang .................... G06K 9/0004
2018/0149792 A1* 5/2018 Lee ...................... G02B 6/0035
2018/0285614 A1* 10/2018 Shen .................... G06K 9/0002

FOREIGN PATENT DOCUMENTS

| CN | 106055162 A | 10/2016 |
|---|---|---|
| CN | 106056099 A | 10/2016 |

\* cited by examiner

DISPLAY PANEL AND DISPLAY DEVICE

CROSS-REFERENCES TO RELATED APPLICATIONS

This application claims priority to Chinese patent application No. CN201710298770.2, filed on Apr. 27, 2017, the disclosure of which is incorporated herein by reference in its entirety.

TECHNICAL FIELD

The present disclosure relates to a display technology, and, in particular, to a display panel and a display device.

BACKGROUND

A fingerprint of a person is unique. With the development of display technology, fingerprint recognition functions appearing on various display devices have appeared on market. Such devices include mobile phones, tablet PCs, intelligent wearable equipment, etc. A user can perform permission validation just by touching, by a finger, the fingerprint recognition sensor of a display device having a fingerprint recognition function before operating this device, thereby simplifying the permission validation process.

In an existing display device having a fingerprint recognition function, the fingerprint recognition module is typically disposed in the non-display area of the display panel. For a display panel with such a structure, to perform the permission validation, a user needs to touch the fingerprint recognition module as a special step, which degrades the user experience. In addition, placing the fingerprint recognition module in the non-display area of the display panel reduces the screen-to-body ratio which goes against the trend towards a narrower bezel of a display panel.

SUMMARY

The present disclosure provides a display panel and a display device to provide a solution for disposing a fingerprint recognition module in the display area of the display panel.

According to the first aspect, an embodiment of the present disclosure provides a display panel including: an array substrate, an encapsulation layer and a fingerprint recognition module.

The array substrate includes a first substrate and a plurality of light-emitting units on the first substrate.

The encapsulation layer is disposed on a side, facing away from the first substrate, of the plurality of light-emitting units. The fingerprint recognition module is disposed on the encapsulation layer and includes at least one fingerprint recognition unit. A vertical projection of the fingerprint recognition unit onto the array substrate is located in a non-light-emitting area of the array substrate, and the non-light-emitting area is located between adjacent ones of the plurality of light-emitting units.

A horizontal distance d between an edge of the fingerprint recognition unit and an edge of the closest one of the plurality of light-emitting units to the fingerprint recognition unit is greater than or equal to a preset distance so that the display panel has a viewing angle $\psi$, where $\psi$ is greater than or equal to 50°.

According to the second aspect, an embodiment of the present disclosure provides a display device including the display panel of any one of the embodiments of the present disclosure.

In the embodiments of the present disclosure, the fingerprint recognition module is disposed on the encapsulation layer of the display panel and the projection of the fingerprint recognition unit onto the array substrate is located in a non-light-emitting area of the array substrate, so that the fingerprint recognition module can be disposed in the display area of the display panel, thereby increasing the screen-to-body ratio of the display panel and following the trend towards a narrow bezel of a display panel. Moreover, since the fingerprint recognition unit is light-proof, the horizontal distance d between the edge of the fingerprint recognition unit and the light-emitting area edge of the closest light-emitting units is set to a value greater than or equal to a preset distance, so that the fingerprint recognition unit disposed in the display area of the display panel does not affect the viewing angle of the display panel, thereby ensuring that the display panel has a large viewing angle and preventing the fingerprint recognition module from blocking the outgoing light for display at a large viewing angle and further affecting the display effect.

DETAILED DESCRIPTION

The present disclosure will be described in further detail with reference to the accompanying drawings and embodiments. It is to be understood that the embodiments set forth below are intended to explain and not to limit the present disclosure. It is also to be noted that for ease of description, only a part related to the present disclosure rather than the whole structure is illustrated in the accompanying drawings.

Figure 1:
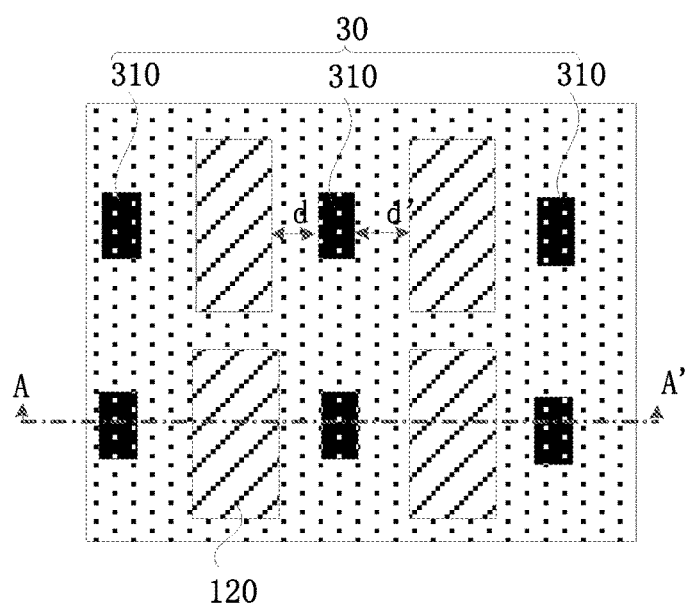
FIG. 1 is a schematic diagram of a display panel according to an embodiment of the present disclosure.
Figure 2:
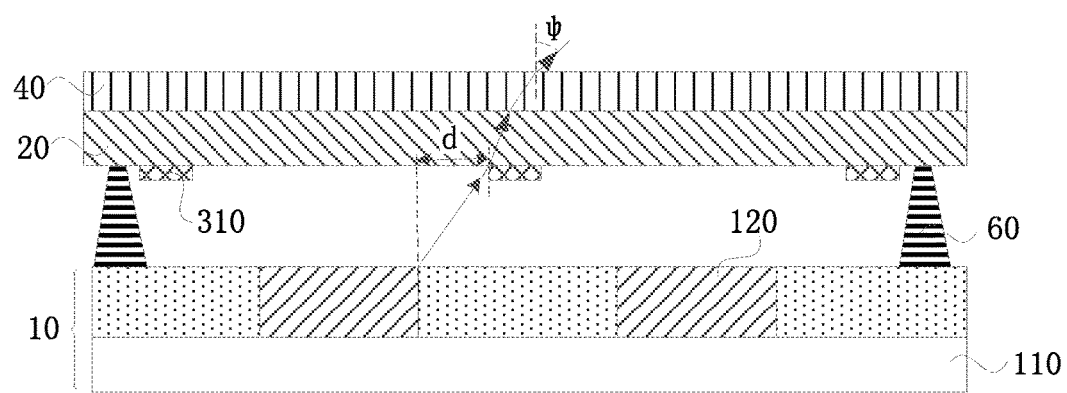
FIG. 2 is a cross sectional view of the display panel shown in FIG. 1 along the line A-A'.

FIG. 1 is a schematic diagram of a display panel according to an embodiment of the present disclosure. FIG. 2 is a cross sectional view of the display panel shown in FIG. 1 taken along the cross sectional line A-A'. Referring to FIG. 1 and FIG. 2, the display panel includes an array substrate 10, an encapsulation layer 20 and a fingerprint recognition module 30.

The array substrate 10 includes a first substrate 110 and a plurality of light-emitting units 120 on the first substrate 110.

The encapsulation layer 20 is disposed on a side, facing away from the first substrate 110, of the plurality of light-emitting units 120. The fingerprint recognition module 30 is disposed on the encapsulation layer 20 and includes at least one fingerprint recognition unit 310. A vertical projection of the fingerprint recognition unit 310 onto the array substrate 10 is located in a non-light-emitting area of the array substrate 10, and the non-light-emitting area is located between adjacent ones of the plurality of light-emitting units 120.

A horizontal distance d between an edge of the fingerprint recognition unit 310 and an edge of the light-emitting unit 120 closest to the fingerprint recognition unit 310 is greater than or equal to a preset distance so that the display panel has a viewing angle $\psi$, where $\psi$ is greater than or equal to 50°.

Specifically, the viewing angle $\psi$ of the display panel is defined as the maximum included angle between any outgoing light and the norm of the light-outgoing surface of the display panel. The greater the viewing angle $\psi$ of the display panel is, the greater the viewing angle of the display panel. Referring to FIG. 2, the display panel may further include a cover plate 40. If the surface, facing away from the array substrate 10, of the cover plate 40 is the light-outgoing surface of the display panel, the maximum included angle between the outgoing light and the norm of the surface, of the cover plate 40 is the viewing angle $\psi$ of the display panel.

Figure 3:
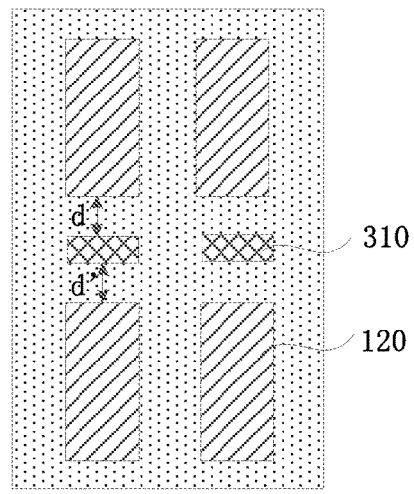
FIG. 3 is a structure diagram of another display panel according to an embodiment of the present disclosure.

Among multiple light-emitting units 120 adjacent to the fingerprint recognition unit 310, the light-emitting unit 120 having an edge closest to the edge of the fingerprint recognition unit 310 is the closest light-emitting unit 120 of the fingerprint recognition unit 310. FIG. 3 is a schematic diagram of another display panel according to an embodiment of the present disclosure. Referring to FIG. 1 and FIG. 3, the non-light-emitting area may be the area between two adjacent columns of light-emitting units 120, or the area between two adjacent rows of light-emitting units 120, and may be selected depending on the arrangement of the light-emitting units 120, i.e., the non-light-emitting area is not specifically limited. Referring to FIG. 1 and FIG. 3, the closest light-emitting unit 120 of the fingerprint recognition unit 310 can be determined based on the distance d from one of the two adjacent columns (or two adjacent rows) of light-emitting units 120 to the fingerprint recognition unit 310 and the distance d' from the other one of the two adjacent columns (or two adjacent rows) of light-emitting units 120 to the fingerprint recognition unit 310. The light-emitting unit 120 with a shorter distance to the fingerprint recognition unit 310 is the closest light-emitting unit 120 of the fingerprint recognition unit 310.

Additionally, in the present embodiments, $\psi$ is set to a value greater than or equal to 50° to satisfy a user's basic requirements for the viewing angle of the display panel so that the user can view a clear display picture when viewing the picture at a slanted angle. It is to be noted that $\psi$ can also be set to a value greater than or equal to 60°, 70°, etc. (of course smaller than 90°) according to a user's basic requirements for the viewing angle of the display panel. The value of $\psi$ is not specifically limited.

In the present embodiments, the fingerprint recognition module 30 is disposed on the encapsulation layer 20 of the display panel and the vertical projection of the fingerprint recognition unit 310 onto the array substrate 10 is located in the non-light-emitting area of the array substrate 10, so that the fingerprint recognition module 30 can be disposed in the display area of the display panel, thereby increasing the screen-to-body ratio of the display panel and following the trend towards the narrow bezel of a display panel. Since the lower surface of the fingerprint recognition unit 310 is light-proof, when the light emitted from the light-emitting unit 120 irradiates the edge of the fingerprint recognition unit 310, this light is blocked by the lower surface of the fingerprint recognition unit 310, thus affecting the viewing angle of the display panel. In the present embodiments, the horizontal distance d between the edge of the fingerprint recognition unit 310 and the light-emitting area edge of the closest light-emitting unit 120 is set to a value greater than or equal to a preset distance, so that the fingerprint recognition unit 310 disposed in the display area of the display panel does not affect the viewing angle of the display panel, thereby ensuring that the display panel has a large viewing angle.

Figure 4:
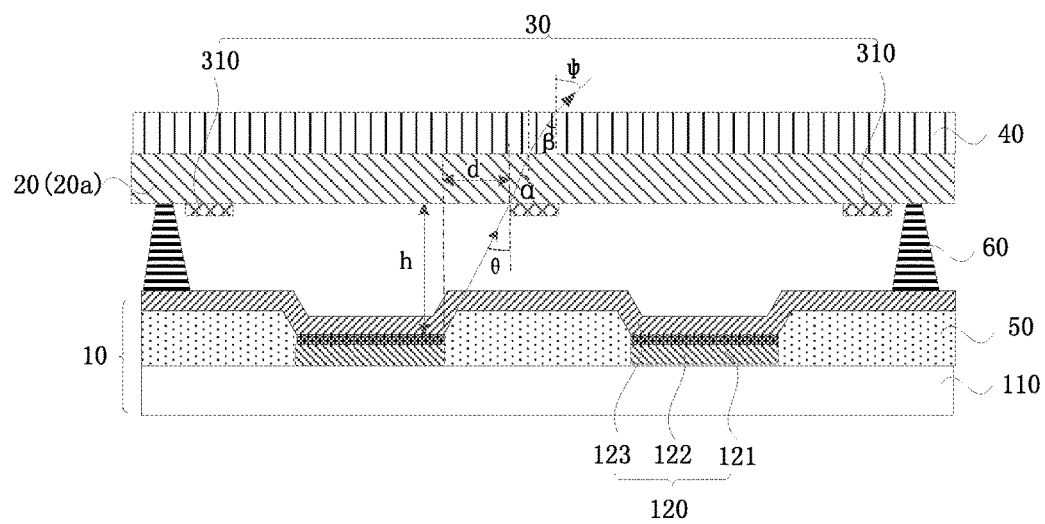
FIG. 4 is a cross sectional view of another display panel according to an embodiment of the present disclosure.

FIG. 4 is a cross sectional view of another display panel according to an embodiment of the present disclosure. Optionally, referring to FIG. 4, a light-emitting unit 120 includes a first electrode 121, a light-emitting layer 122 and a second electrode 123. The light-emitting layer 122 is disposed between the first electrode 121 and the second electrode 123. The array substrate 10 further includes a pixel defining layer 50. The pixel defining layer 50 has a plurality of opening areas, and the light-emitting layer 122 of the light-emitting unit 120 is disposed in an opening area.

The second electrode 123 covers the light-emitting layer 122 and a non-opening area of the pixel defining layer 50.

The vertical projection of the fingerprint recognition unit 310 onto the array substrate 10 is located in the non-opening area of the pixel defining layer 50.

Specifically, the first electrode 121 may be an anode, the second electrode 123 may be a cathode, and the light-emitting layer 122 may be a red light-emitting layer, a green light-emitting layer or a blue light-emitting layer. Since the first substrate 110 is further provided with structures such as a drive circuit (not shown in FIG. 4) for driving the light-emitting units 120, the pixel defining layer 50 is used for, on the one hand, covering the drive circuit and other structures on the first substrate 110 and, on the other hand, defining light-emitting areas and non-light-emitting areas on the array substrate 10, i.e., defining each light-emitting unit 120. The opening areas of the pixel defining layer 50 are light-emitting areas of the array substrate 10 and the non-opening areas of the pixel defining layer 50 are non-light-emitting areas of the array substrate 10.

Optionally, referring to FIG. 4, an encapsulation layer 20 is a transparent rigid cover plate 20a; and a fingerprint recognition module 30 is disposed on a side, close to the array substrate 10, of the transparent rigid cover plate 20a.

Then $d \geq h*\tan \psi$ applies, where h denotes the vertical distance from the fingerprint recognition unit 310 to the light-outgoing side of the light-emitting layer 122 of the light-emitting unit 120.

Specifically, referring to FIG. 4, a support 60 is disposed between the transparent rigid cover plate 20a and the array substrate 10 to support the transparent rigid cover plate 20a, and the gap between the transparent rigid cover plate 20a and the array substrate 10 is filled with air or nitrogen. The light emitted from the light-emitting layer 122 of the light-emitting unit 120 goes out into the air after having passed through the second electrode 123, the gap between the transparent rigid cover plate 20a and the array substrate 10, the transparent rigid cover plate 20a and the cover plate 40. Since the second electrode 123 is thin and has little impact on light propagation, light refraction by the second electrode 123 is neglected during light propagation. According to Snell's law, when light propagates from media 1 to media 2 to medium 3, the input angle θ changes to output angle β. If light returns to the same media 1, the exit angle ψ is the input angle θ:

$$n_1 \sin \theta = n_2 \sin \alpha = n_3 \sin \beta = n_1 \sin \psi. \quad (1)$$

From the above formula, the following formulas can be obtained: $\theta = \psi$ and $$\tan \psi = \tan \theta = \frac{d}{h}. \quad (2)$$

Thus, when the display panel has the viewing angle ψ, the formula $d = h*\tan \psi$ applies. Therefore, the preset distance is $h*\tan \psi$, and when d is greater than or equal to $h*\tan \psi$, the display panel has the viewing angle ψ.

Herein, $n_1$ is the refractive index of air, $n_2$ is the refractive index of the transparent rigid cover plate 20a, and $n_3$ is the refractive index of the cover plate 40. θ denotes the propagation angle of the light in the gap having refractive index of air between the transparent rigid cover plate 20a and the array substrate 10, α is the propagation angle of the light in the transparent rigid cover plate 20a, and β is the propagation angle of the light in the cover plate 40. The propagation angle is the angle between the light and the norm of each film layer of the display panel.

Optionally, if h=4 μm and ψ≥50°, then d≥4.8 μm. h may be calculated according to the thickness of the second electrode 123, the thickness of the pixel defining layer 50 and the thickness of the support 60. It is to be noted that h=4 μm is obtained according to the industry-wide thickness of each film layer of the display panel. When the thickness of each film layer of the display panel is changed, h may take other values. The value of h is not specifically limited in the present disclosure.

In the present embodiment, the fingerprint recognition module 30 is disposed on the side, towards the array substrate 10, of the transparent rigid cover plate 20a, and the horizontal distance d between the edge of the fingerprint recognition unit 310 and the light-emitting area edge of the closest light-emitting unit 120 is set to a value greater than or equal to $h*\tan \psi$, so that, on the one hand, the fingerprint recognition module 30 can be disposed in the display area of the display panel, thereby increasing the screen-to-body ratio of the display panel and, on the other hand, the display panel can have the viewing angle ψ, thereby ensuring that the display panel has a large viewing angle and thus improving the user experience. Moreover, in the manufacturing process of the display panel, the fingerprint recognition module 30 may be first formed on the surface of the transparent rigid cover plate 20a, and then the transparent rigid cover plate 20a may be bonded to the array substrate 10, so that the high-temperature technique or the like in the manufacturing process of the fingerprint recognition module 30 does not affect the structures of light-emitting units 120 or the like on the array substrate 10.

Figure 5:
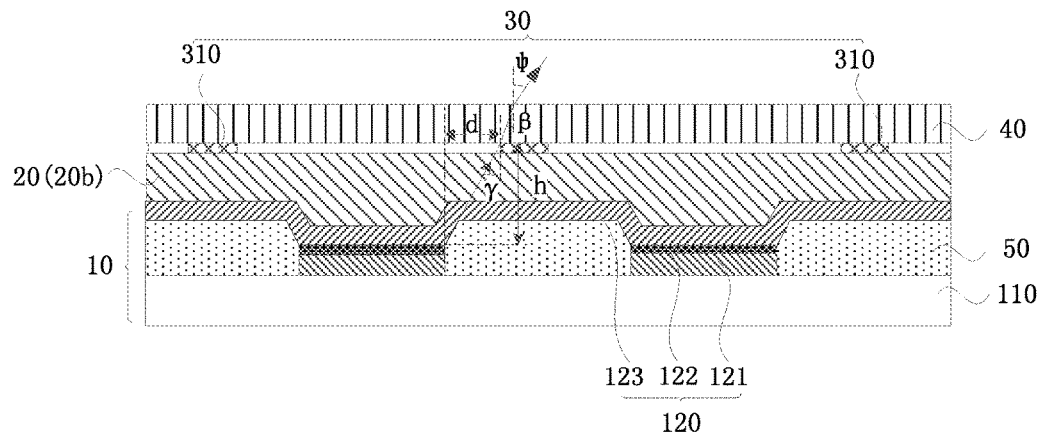
FIG. 5 is a cross sectional view of another display panel according to an embodiment of the present disclosure.

FIG. 5 is a cross sectional view of another display panel according to an embodiment of the present disclosure. Optionally, referring to FIG. 5, an encapsulation layer 20 is a thin film encapsulation layer 20b; and a fingerprint recognition module 30 is disposed on a side, facing away from the array substrate 10, of the thin film encapsulation layer 20b. Specifically, the thin film encapsulation layer 20b may include organic layers and inorganic layers which are alternatively arranged, and both aside, towards the array substrate 10, of the thin film encapsulation layer 20b and a side, facing away from the array substrate 10, of the thin film encapsulation layer 20b are inorganic layers so as to better resist water and oxygen.

Optionally, if the processing temperature of the fingerprint recognition unit 310 is low and does not affect other film layers of the display panel in the manufacturing process, then the fingerprint recognition unit 310 may be formed directly on the surface of the thin film encapsulation layer 20b. If the processing temperature of the fingerprint recognition unit 310 is high and may affect the light-emitting units 120 in the manufacturing process, then the fingerprint recognition unit 310 may be first formed on a substrate and then the substrate may be bonded to the thin film encapsulation layer 20b.

Optionally, referring to FIG. 5, the fingerprint recognition module 30 is formed on a surface, facing away from the array substrate 10, of the thin film encapsulation layer 20b. Then $$\frac{n_{TFE}*d}{\sqrt{d^2+h^2}} \geq \sin \psi$$

applies, where h denotes the vertical distance from the fingerprint recognition unit 310 to the light-outgoing side of the light-emitting layer 122 of the light-emitting unit 120 and $n_{TFE}$ is the refractive index of the thin film encapsulation layer 20b.

Specifically, referring to FIG. 5, the light emitted from the light-emitting layer 122 of the light-emitting unit 120 goes out into the air after passing through the second electrode 123, the thin film encapsulation layer 20b and the cover plate 40. Since the second electrode 123 is thin and has insignificant impact on light propagation, light attenuation by the second electrode 123 is neglected during light propagation. The fingerprint recognition unit 310 is thin and its impact is insignificant. According to Snell's law, the following formulas can be obtained:

$$n_{TFE}\sin\gamma = n_3\sin\beta = n_1\sin\psi, \quad (3)$$

$$\sin\gamma = \frac{d}{\sqrt{d^2+h^2}}. \quad (4)$$

From the above formulas, the following formula can be obtained:

$$\frac{n_{TFE}*d}{\sqrt{d^2+h^2}} = \sin\psi.$$

Thus, when the display panel has the viewing angle $\psi$, the formula $$\frac{n_{TFE}*d}{\sqrt{d^2+h^2}} = \sin\psi$$

applies. Therefore, when $$\frac{n_{TFE}*d}{\sqrt{d^2+h^2}} \geq \sin\psi$$

applies, the display panel has the viewing angle $\psi$.

Herein, $n_1=1$ and $n_3$ is the refractive index of the cover plate 40. $\gamma$ denotes the propagation angle of the light in the thin film encapsulation layer 20b and $\beta$ denotes the propagation angle of the light in the cover plate 40.

Optionally, if $h_1=8$ μm, $n_{TFE}=1.5$ and $\psi \geq 50°$, then $d \geq 4.7$ μm applies. Herein, h may be calculated from the thickness of the thin film encapsulation layer 20b and the thickness of the second electrode 123. Furthermore, thick materials in the thin film encapsulation layer 20b are typically organic materials while inorganic materials are light and thin, and therefore, the refractive index of the thin film encapsulation layer 20b may be the refractive index of organic materials, i.e., 1.5. It is to be noted that the values of $h_1$ and $h_2$ are obtained according to the industry-wide thickness of each film layer of the display panel. When the thickness of each film layer of the display panel is changed, $h_1$ and $h_2$ may take other values. The values of $h_1$ and $h_2$ are not specifically limited in the present disclosure.

Figure 6:
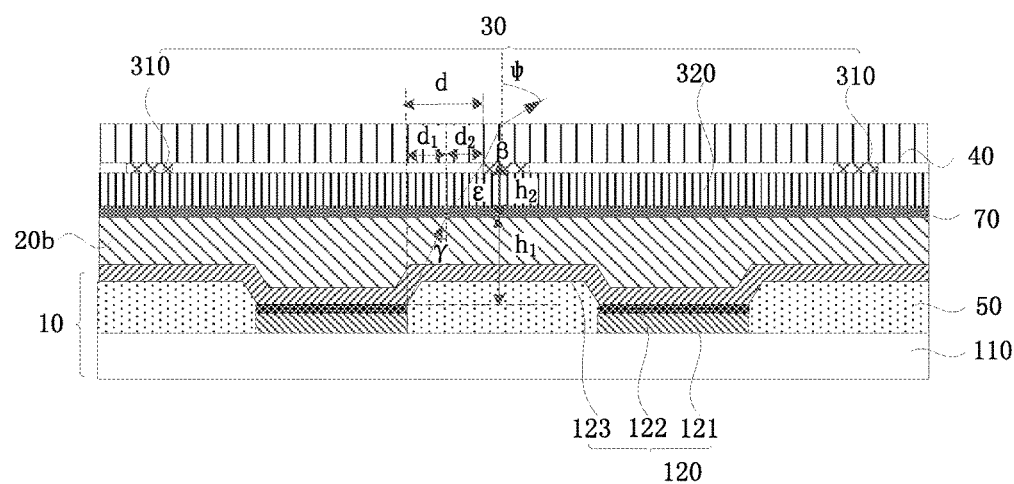
FIG. 6 is a cross sectional view of another display panel according to an embodiment of the present disclosure.

FIG. 6 is a cross sectional view of another display panel according to an embodiment of the present disclosure. Referring to FIG. 6, the fingerprint recognition module 30 further includes a second substrate 320 on which the fingerprint recognition unit 310 is formed. A side, facing away from the fingerprint recognition unit 310, of the second substrate 320 is bonded by an adhesive layer 70 to the surface, facing away from the array substrate 10, of the thin film encapsulation layer 20b.

Then $d=d1+d2$, where $$\frac{n_{TFE}*d_1}{\sqrt{d_1^2+h_1^2}} \geq \sin\psi \text{ and } \frac{n_{PI}*d_2}{\sqrt{d_2^2+h_2^2}} \geq \sin\psi$$

apply. Herein, $n_{TFE}$ is the refractive index of the thin film encapsulation layer 20b. $h_1$ is the vertical distance from the interface between the thin film encapsulation layer 20b and the adhesive layer 70 to the light-outgoing side of the light-emitting layer 122 of the light-emitting unit 120, and d1 is the horizontal distance to the light-emitting area edge from the outgoing point of light outgoing from the light-emitting area edge of the light-emitting unit 120 on the interface between the thin film encapsulation layer 20b and the adhesive layer 70. $n_{PI}$ is the refractive index of the second substrate 320. $h_2$ is the sum of the thickness of the adhesive layer 70 and the thickness of the second substrate 320, and d2 is the horizontal distance to the edge of the fingerprint recognition unit 310 from the outgoing point of light outgoing from the light-emitting area edge of the light-emitting unit 120 on the interface between the thin film encapsulation layer 20b and the adhesive layer 70.

Specifically, referring to FIG. 6, the light emitted from the light-emitting layer 122 of the light-emitting unit 120 goes out into the air after having passed through the second electrode 123, the thin film encapsulation layer 20b, the adhesive layer 70, the second substrate 320 and the cover plate 40. Since the second electrode 123 and the adhesive layer 70 are thin and hardly affect the light propagation, the light refraction by the second electrode 123 and the adhesive layer 70 is neglected during light propagation. The fingerprint recognition unit 310 is thin and its thickness is ignored. According to the refraction law, the following formulas can be obtained:

$$n_{TFE}\sin\gamma = n_{PI}\sin\varepsilon = n_3\sin\beta = n_1\sin\psi, \quad (5)$$

$$\sin\gamma = \frac{d_1}{\sqrt{d_1^2+h_1^2}}, \sin\varepsilon = \frac{d_2}{\sqrt{d_2^2+h_2^2}}. \quad (6)$$

From the above formulas, the following formulas can be obtained:

$$\frac{n_{TFE}*d_1}{\sqrt{d_1^2+h_1^2}} = \sin\psi,$$

$$\frac{n_{PI}*d_2}{\sqrt{d_2^2+h_2^2}} = \sin\psi.$$

Thus, when the display panel has the viewing angle $\psi$, the formulas $$\frac{n_{TFE}*d_1}{\sqrt{d_1^2+h_1^2}} = \sin\psi \text{ and } \frac{n_{PI}*d_2}{\sqrt{d_2^2+h_2^2}} = \sin\psi$$

apply. Therefore, when $$\frac{n_{TFE} * d_1}{\sqrt{d_1^2 + h_1^2}} \geq \sin\psi \text{ and } \frac{n_{PI} * d_2}{\sqrt{d_2^2 + h_2^2}} \geq \sin\psi$$

apply, the display panel has the viewing angle $\psi$.

Here, $n_1=1$ and $n_3$ is the refractive index of the cover plate 40. γ denotes the propagation angle of the light in the thin film encapsulation layer 20b, E denotes the propagation angle of the light in the second substrate 320, and β denotes the propagation angle of the light in the cover plate 40.

Optionally, if $h_1=8$ μm, $n_{TFE}=1.5$, $h_2=10$ μm, $n_{PI}=1.6$ and $\psi \geq 50°$, then d1≥4.7 μm and d2≥5.4 μm apply, and thus d≥10.1 μm applies.

In the present embodiment, the fingerprint recognition module 30 is disposed on the side, facing away from the array substrate 10, of the thin film encapsulation layer 20b, and the horizontal distance d between the edge of the fingerprint recognition unit 310 and the light-emitting area edge of the closest light-emitting unit 120 is set to a value greater than or equal to a preset distance, so that the fingerprint recognition module 30 can be disposed in the display area of the display panel, thereby increasing the screen-to-body ratio of the display panel and the display panel can have the viewing angle kV, thereby ensuring that the display panel has a large viewing angle and thus improving the user experience. Since the fingerprint recognition module 30 is disposed after the thin film encapsulation layer 20b has been manufactured, it is ensured that the thin film encapsulation layer 20b can block water and oxygen effectively and the probability that the display panel is corroded is reduced.

Figure 7:
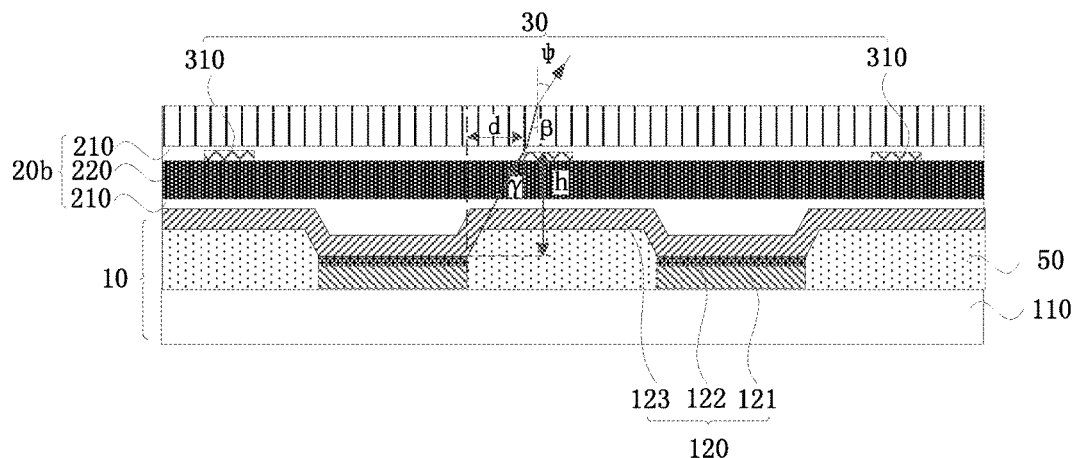
FIG. 7 is a cross sectional view of another display panel according to an embodiment of the present disclosure.

FIG. 7 is a cross sectional view of another display panel according to an embodiment of the present disclosure. Optionally, referring to FIG. 7, the fingerprint recognition unit 310 may also be disposed inside the thin film encapsulation layer 20b. The thin film encapsulation layer 20b may include inorganic layers 210 and organic layers 220 which are alternatively arranged. The fingerprint recognition unit 310 may be disposed on a side, facing away from an array substrate 10, of the inorganic layer 210 or the organic layer 220.

Referring to FIG. 7, the thin film encapsulation layer 20b includes two inorganic layers 210 and one organic layer 220, and the fingerprint recognition unit 310 is disposed directly on the surface, facing away from the array substrate 10, of the thin film encapsulation layer 20b.

Since the inorganic layers 210 are thin, the light refraction by the inorganic layers 210 is neglected. According to the refraction law, when the display panel has the viewing angle $\psi$, the formula d=h*tan $\psi$ applies. Therefore, the preset distance is h*tan $\psi$, and when d is greater than or equal to the preset distance, the display panel has the viewing angle $\psi$.

Specifically, the fingerprint recognition module 30 is disposed inside the thin film encapsulation layer 20b so that the vertical distance h from the fingerprint recognition unit 310 to the light-outgoing side of the light-emitting layer 122 of the light-emitting unit 120 is reduced and thereby the preset distance is reduced and the value range of d is larger, i.e., the position of the fingerprint recognition unit 310 can be set more flexibly.

Moreover, the fingerprint recognition unit 310 may be disposed on the side, close to the array substrate 10, of the thin film encapsulation layer 20b as long as the fingerprint recognition unit 310 is insulated from the second electrode 123. When the fingerprint recognition unit 310 is disposed on the side, towards the array substrate 10, of the thin film encapsulation layer 20b, since the vertical distance from the fingerprint recognition unit 310 to the light-outgoing side of the light-emitting layer 122 is short and has little impact on the viewing angle of the light emitted from the light-emitting layer 122, the preset distance may be any value greater than or equal to zero.

It is to be noted that, in the present embodiment, a configuration in which the side of the encapsulation layer 20 (the transparent rigid cover plate 20a or the thin film encapsulation layer 20b) away from the array substrate 10 is only provided with the cover plate 40 is exemplarily illustrated. Such configuration is just an example and is not intended to limit the present disclosure. A film layer such as a polarizer may also be disposed between the encapsulation layer 20 and the cover plate 40. When other film layers are disposed between the encapsulation layer 20 and the cover plate 40, the preset distance can be obtained using the above derivation according to the refraction law.

Figure 8A:
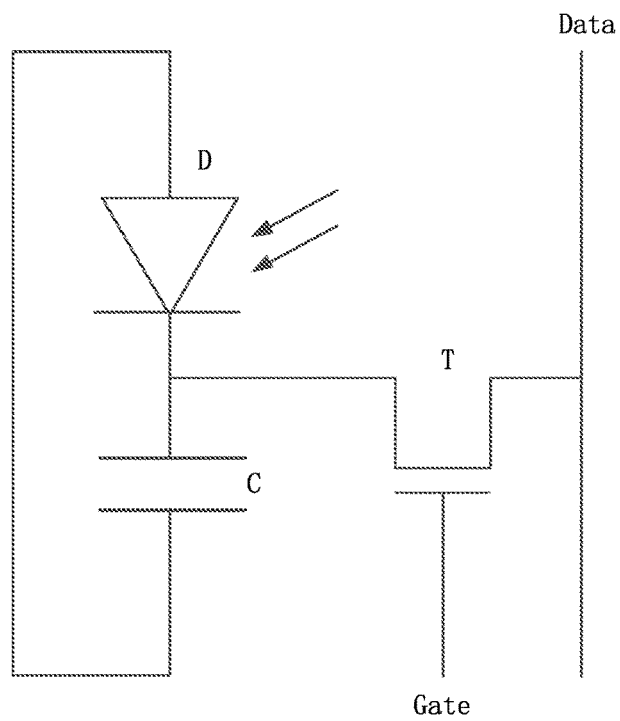
FIG. 8A is a circuitry diagram of a fingerprint recognition unit according to an embodiment of the present disclosure.
Figure 8B:
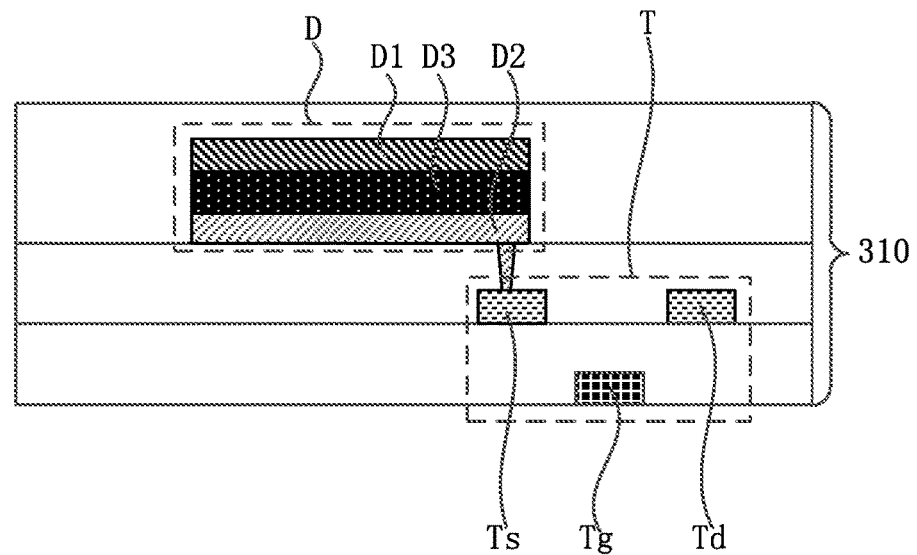
FIG. 8B is a schematic diagram illustrating the film layers of a fingerprint recognition unit according to an embodiment of the present disclosure.

FIG. 8A is a structure diagram of a fingerprint recognition unit according to an embodiment of the present disclosure. FIG. 8B is a schematic diagram illustrating the film layers of the fingerprint recognition unit according to an embodiment of the present disclosure. Referring to FIG. 8A and FIG. 8B, the fingerprint recognition unit may include a photosensitive diode D, a storage capacitor C and a thin film transistor T.

An anode D1 of the photosensitive diode D is electrically connected to a first electrode of the storage capacitor C, and a cathode D2 of the photosensitive diode D is electrically connected to a second electrode of the storage capacitor C and to a source electrode Ts of the thin film transistor T. A gate electrode Tg of the thin film transistor T is electrically connected to a switch control line Gate, and a drain electrode Td of the thin film transistor T is electrically connected to a signal detection line Data.

The photosensitive diode D is used for converting light reflected by a touch body into a current signal.

In a fingerprint recognition stage, the thin film transistor T is turned on and the current signal is transmitted by the thin film transistor T to the signal detection line Data such that fingerprint recognition is performed according to the current signal.

Figure 9:
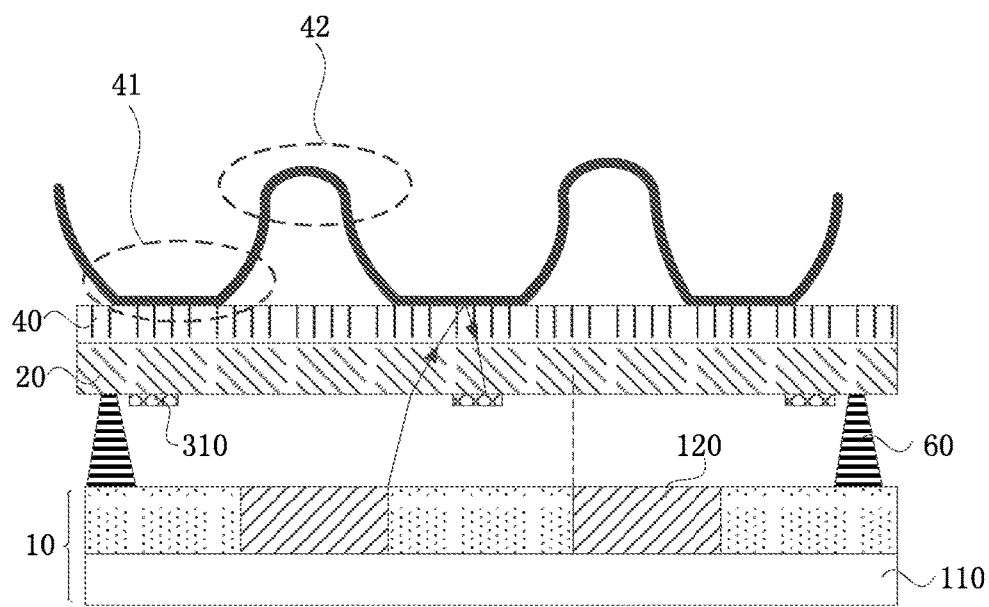
FIG. 9 is a schematic diagram illustrating the operating principle of the fingerprint recognition of the fingerprint recognition module according to an embodiment of the present disclosure.

Specifically, the photosensitive diode D further includes a PIN junction D3 between the anode D1 and the cathode D2. The cathode D2 is made from an opaque metal, and the boundary of the PIN junction D3 does not exceed the boundary of the cathode D2. The anode D1 of the photosensitive diode D is disposed on a side, facing away from the array substrate, of the PIN junction D3. The PIN junction D3 is photosensitive and of one-way electric conductivity. When there is no light, the PIN junction D3 has a small reverse saturation leakage current, i.e., dark current. In this case, the photosensitive diode D is turned off. When irradiated by the light, the reverse saturation leakage current of the PIN junction D3 dramatically increases to form a light current. The light current varies with the intensity of the incident light. FIG. 9 is a schematic diagram illustrating the operation principle of the fingerprint recognition of the fingerprint recognition module according to an embodiment of the present disclosure. Optionally, the light-emitting unit 120 may provide a light source for the fingerprint recognition unit 310, and the light emitted from the light-emitting unit 120 is reflected by the touch body onto the fingerprint recognition unit 310 such that fingerprint recognition is performed. By such configuration, the need to provide an additional light source for the fingerprint recognition unit 310 is eliminated, reducing the thickness of the display panel and the processing steps of the display panel.

The fingerprint recognition principle will be described below in detail with reference to FIG. 8A, FIG. 8B and FIG. 9. In the fingerprint recognition stage, a driver chip (not shown in FIG. 8A, FIG. 8B and FIG. 9) electrically connected to the fingerprint sensor controls, via the switch control line Gate, the thin film transistor T of the fingerprint recognition unit 310 to be turned on. When a user presses a finger against the display panel, the light emitted from the light-emitting unit 120 reaches the finger and is reflected from the surface of the fingerprint to form reflected light. The reflected light formed by fingerprint reflection enters the fingerprint recognition unit 310, and is received by the photosensitive diode D of the fingerprint recognition unit 310, and then converted into the current signal. The current signal is transmitted by the thin film transistor T to the signal detection line Data. A ridge 41 in the fingerprint pressed against the display panel is in contact with the surface of the display panel, while a valley 42 is not in contact with the surface of the display panel, thus causing a difference between light reflectance on the valley 42 and light reflectance on the ridge 41 and further causing a difference between the intensity of reflected light formed at the ridge 41 received by the fingerprint sensor and the intensity of reflected light formed at the valley 42 received by the fingerprint sensor. As a result, the intensity of the current signal converted from the reflected light formed at the ridge 41 is different from the intensity of the current signal converted from the reflected light formed at the valley 42. Fingerprint recognition is performed according to the current signal intensity.

Figure 10:
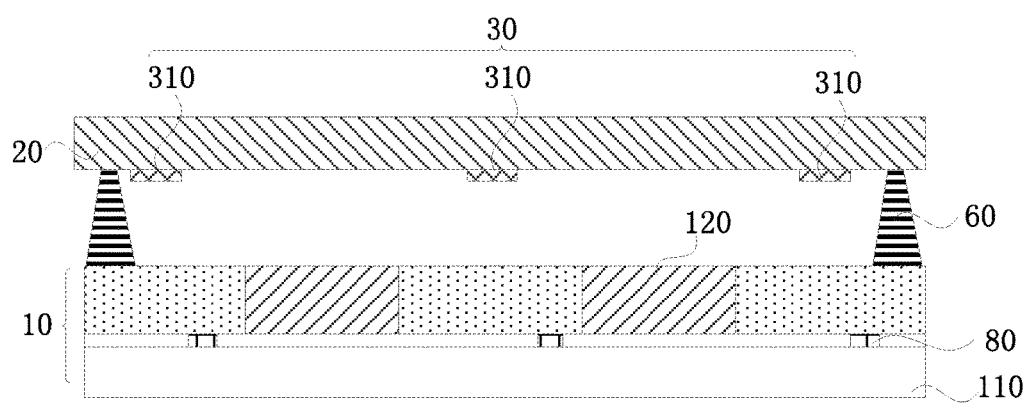
FIG. 10 is a cross sectional view of another display panel according to an embodiment of the present disclosure.

FIG. 10 is a cross sectional view of another display panel according to an embodiment of the present disclosure. Optionally, referring to FIG. 10, the display panel may further include a fingerprint recognition light source 80.

The fingerprint recognition light source 80 is disposed on a side, facing away from a fingerprint recognition module 30, of the light-emitting unit 120. Light emitted from the fingerprint recognition light source 80 is reflected by a touch body onto a fingerprint recognition unit 310 such that fingerprint recognition is performed. To improve the precision of fingerprint recognition, optionally, the fingerprint recognition light source 80 is a collimated light source. Compared with the use of an area light source, the use of a collimated light source can reduce interference of the light scattered by the fingerprint between different fingerprint recognition units 310, thus improving the precision of fingerprint recognition. However, since the collimated light source is often thicker than the area light source, the use of the collimated light source increases the thickness of the display panel.

Figure 11:
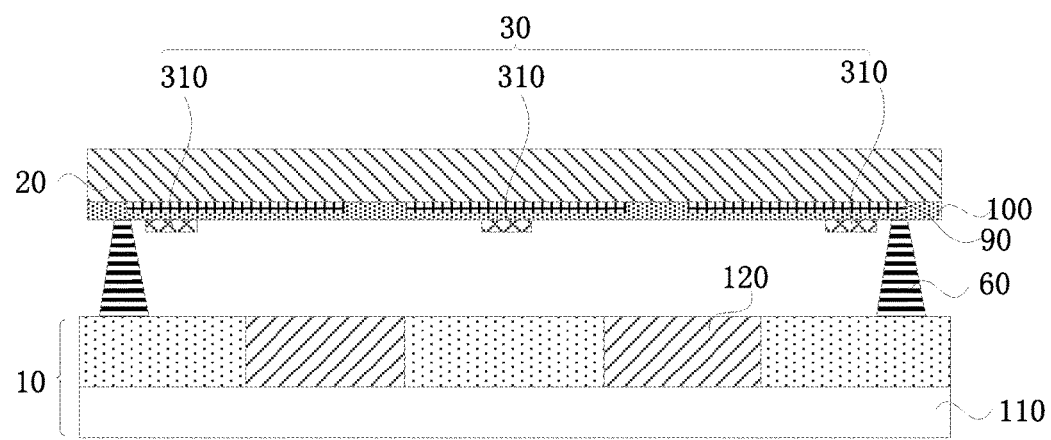
FIG. 11 is a cross sectional view of another display panel according to an embodiment of the present disclosure.

FIG. 11 is a cross sectional view of another display panel according to an embodiment of the present disclosure. Optionally, referring to FIG. 11, the display panel may further include a touch electrode 90. The fingerprint recognition module 30 and the touch electrode 90 are disposed on the same side of the encapsulation layer 20. Specifically, when the fingerprint recognition module 30 and the touch electrode 90 are disposed on the same side of the encapsulation layer 20, an insulating layer 100 is disposed between the touch electrode 90 and the fingerprint recognition module 30 to avoid mutual interference. The touch electrode 90, which is not specifically limited, may be a mutual-capacitive touch electrode or a self-capacitive touch electrode.

Figure 12:
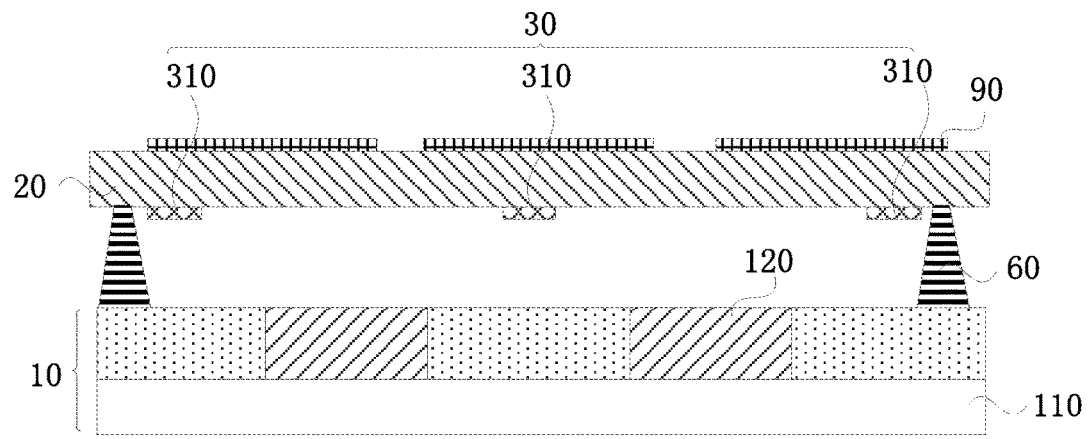
FIG. 12 is a cross sectional view of another display panel according to an embodiment of the present disclosure.

FIG. 12 is a cross sectional view of another display panel according to an embodiment of the present disclosure. Optionally, referring to FIG. 12, the fingerprint recognition module 30 and the touch electrode 90 are disposed on different sides of the encapsulation layer 20. Such configuration avoids mutual interference between the touch electrode 90 and the fingerprint recognition module 30 even no insulating layer is disposed, thereby reducing the thickness of the display panel and the processing steps.

Figure 13A:
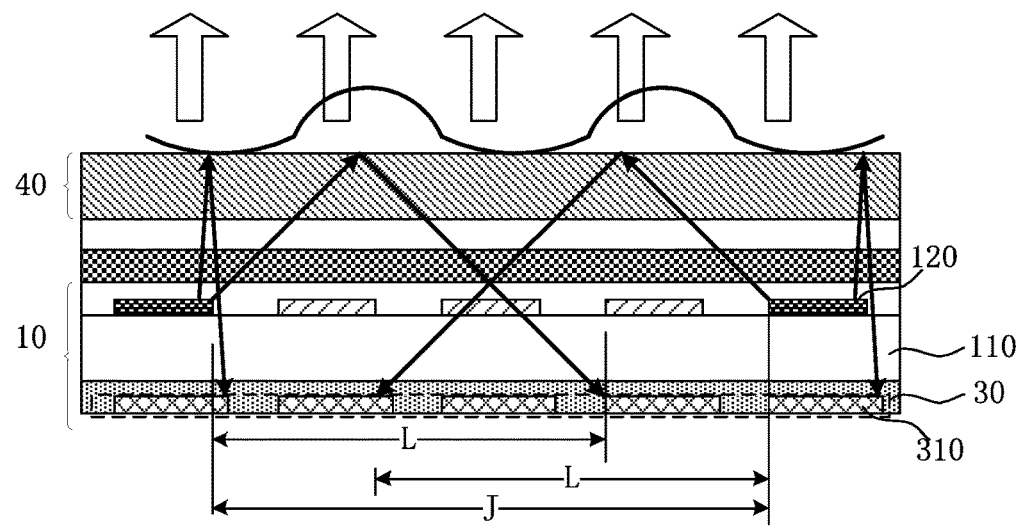
FIG. 13A is another cross sectional view of a display panel according to an embodiment of the present disclosure.
Figure 13B:
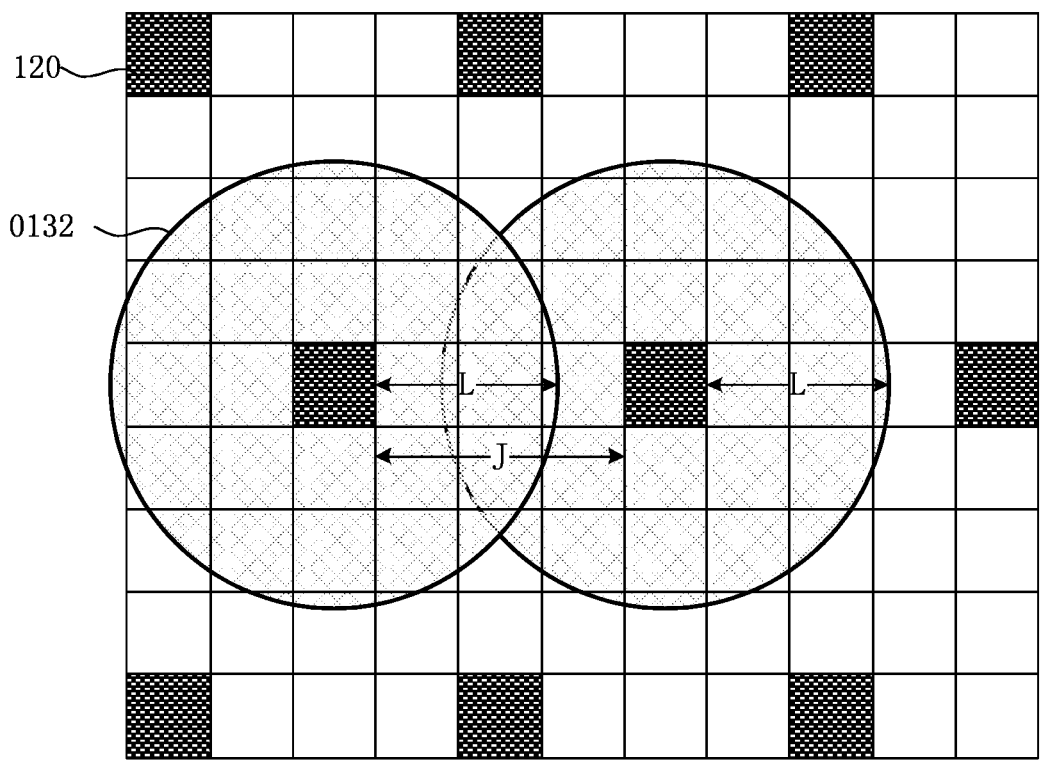
FIG. 13B is a top view of a part of the display panel according to an embodiment of FIG. 13A.
Figure 13C:
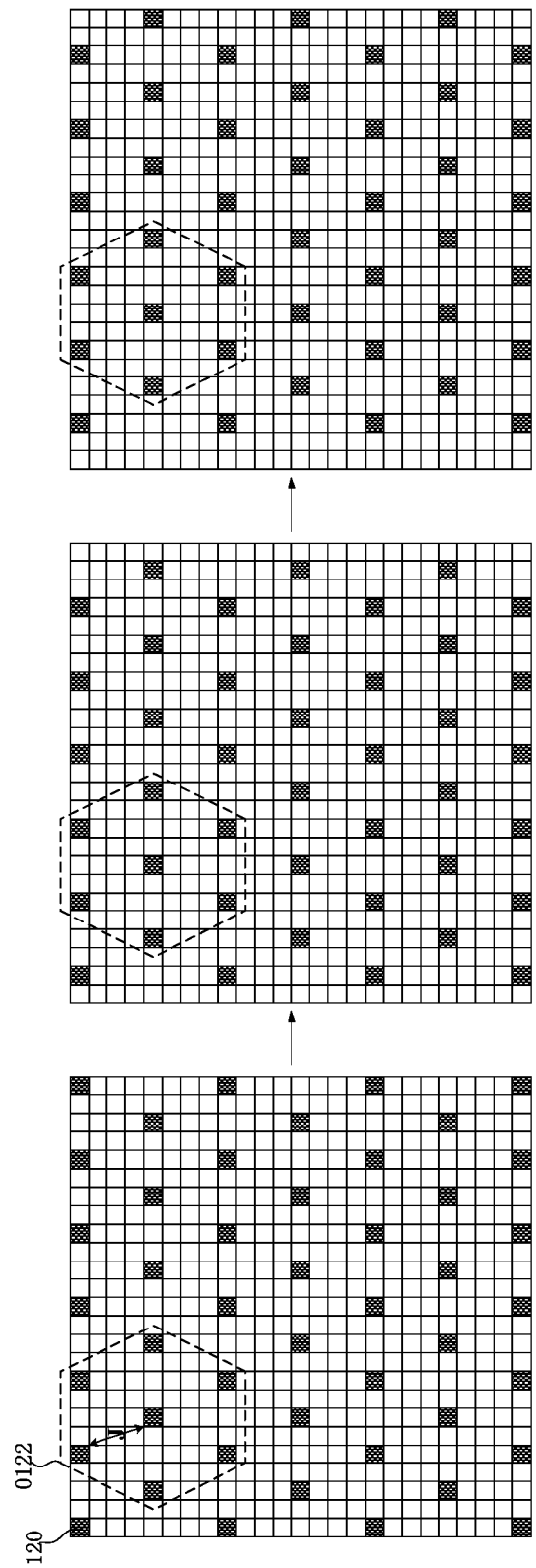
FIG. 13C shows three fingerprint recognition scanning stages according to an embodiment of FIG. 13A.

Additionally, the inventors have found during the research that the existing display devices with a fingerprint recognition function may have the following problems: lights emitted from the fingerprint recognition light source are reflected by a finger and then irradiates multiple fingerprint recognition units, so that in addition to receiving the fingerprint signal at the corresponding position, each fingerprint recognition unit also receives interfering signals from other positions, thus affecting the fingerprint recognition precision of the fingerprint recognition unit. To solve the above problems, the present disclosure proposes the following solutions:

FIG. 13A is a cross sectional view of another display panel according to an embodiment of the present disclosure. FIG. 13B is a partial top view of the display panel shown in FIG. 13A. FIG. 13C is a scanning diagram of the display panel shown in FIG. 13A in the fingerprint recognition stage. The display panel provided by the present embodiment includes an array substrate 10, a fingerprint recognition module 30 and a cover plate 40. The array substrate 10 includes a first substrate 110 and a plurality of light-emitting units 120 on the first substrate 110. The organic light-emitting units 120 are disposed on a side, towards the cover plate 40, of the first substrate 110. The fingerprint recognition module 30 includes at least one fingerprint recognition unit 310. A first surface, facing away from the array substrate 10, of the cover plate 40 is a light-outgoing surface of the display panel. Referring to FIG. 13A, FIG. 13B and FIG. 13C, in the fingerprint recognition stage, a plurality of organic light-emitting units 120 emit light in a displacement manner according to a first light-emitting dot matrix 0122. A distance J between any two adjacent organic light-emitting units 120 in the first light-emitting dot matrix 0122 is greater than or equal to the minimum non-interference distance L. The minimum non-interference distance L is the maximum radius of the coverage area 0132 on the fingerprint recognition module 30 of the light emitted from any organic light-emitting unit 120 and reflected by the first surface of the cover plate 40. In the present embodiment, optionally, the display panel is an organic light-emitting display panel and the plurality of fingerprint recognition units 310 correspond to the plurality of organic light-emitting units 120, respectively.

Figure 14:
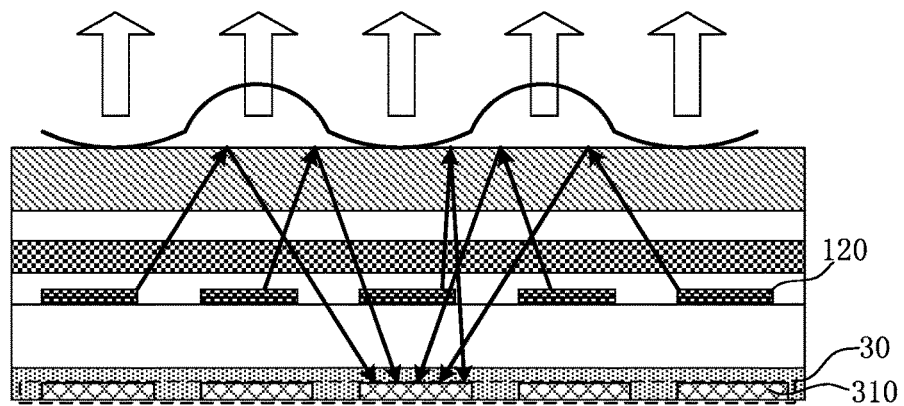
FIG. 14 shows a mechanism of cross talks inside the display panel.

In the display panel provided by the present embodiment, the plurality of organic light-emitting units 120 are used as the light source for the plurality of fingerprint recognition units 310 to perform fingerprint recognition. When a user's finger is pressed against the first surface of the cover plate 40, light emitted from an organic light-emitting unit 120 passes through the cover plate 40 and illuminates the finger. The reflected light formed by fingerprint reflection passes through the first surface of the cover plate 40 and illuminates the fingerprint recognition unit 310 corresponding to the illuminated organic light-emitting unit 120. The fingerprint recognition unit 310, which receives the fingerprint-reflected light, produces a sensing signal. A fingerprint recognition circuit of the display panel may perform fingerprint recognition according to the sensing signal. The reason why the first light-emitting dot matrix 0122 is used as the detection light source of the fingerprint recognition unit 310 is that the light emitted from the organic light-emitting unit 120 has a wide range of angular distribution. As shown in FIG. 14, if all organic light-emitting units 120 on the display panel emit light simultaneously to perform fingerprint recognition, then in addition to receiving the fingerprint-reflected light of the corresponding organic light-emitting unit 120, each fingerprint recognition unit 310 also receives interference signals from multiple other organic light-emitting units 120. As a result, the fingerprint recognition precision decreases.

To increase the fingerprint recognition precision, in the display panel provided in the present embodiment, the organic light-emitting units 120 emit light in a displacement manner according to the first light-emitting dot matrix 0122 in the fingerprint recognition stage. The distance J between any two adjacent organic light-emitting units 120 in the first light-emitting dot matrix 0122 is greater than or equal to the minimum non-interference distance L. As shown in FIG. 13A and FIG. 13B, the light emitted from the organic light-emitting unit 120 has an angular distribution, so after being reflected by the first surface of the cover plate 40, the light emitted from the organic light-emitting unit 120 forms a coverage area 0132 on the fingerprint recognition module 30. The fingerprint-reflected light of the light emitted at any angle from the organic light-emitting unit 120 falls within the coverage area 0132. The maximum radius of the coverage area 0132 is the minimum interference distance L. In the present embodiment, the distance J between any two adjacent organic light-emitting units 120 in the first light-emitting dot matrix 0122 is greater than or equal to the minimum non-interference distance L, so the fingerprint-reflected light of any one of the organic light-emitting units 120 which is emitting light never illuminates the fingerprint recognition units 310 corresponding to other organic light-emitting units 120 that emit light at the same time. That is, the fingerprint recognition unit 310 corresponding to any one of the organic light-emitting units 120 in the first light-emitting dot matrix 0122 can receive only the fingerprint-reflected light of the corresponding organic light-emitting unit 120. Therefore, in the display panel provided by the present embodiment, a fingerprint recognition unit 310 does not receive interference signals of other organic light-emitting units. Accordingly, the fingerprint recognition circuit of the display panel performs fingerprint recognition according to the sensing signal produced by this fingerprint recognition unit 310, thus increasing the fingerprint recognition precision of the display panel.

It is to be noted that the fingerprint-reflected light is the reflected light formed by reflection of the light, which is emitted from the organic light-emitting unit 120, by the fingerprint of the user's finger pressed against the first surface of the cover plate 40. In contrast to the thickness of the display panel, the distance between the fingerprint of the user's finger and the first surface of the cover plate 40 is small and has little impact on the range of the coverage area 0132. Therefore, the reflective distance between the user's finger and the first surface of the cover plate 40 is omitted when the minimum non-interference distance L is set in the present embodiment. Furthermore, in theory, the radius L of the coverage area 0132 should be calculated with the center point of the organic light-emitting unit 120 as the origin. However, in practice, the quantity of the organic light-emitting units 120 is very large and the sizes of the organic light-emitting unit 120 accordingly. Therefore, in the present embodiment, the organic light-emitting unit 120 as a whole may be regarded as the origin of the coverage area 0132, so the radius L of the coverage area 0132 may be denoted as the distance from the edge of the organic light-emitting unit 120 to the edge of the coverage area 0132 and the size of the organic light-emitting unit 120 may be excluded from the minimum non-interference distance L. It is to be understood by those skilled in the art that the minimum non-interference distance L is related to the thickness of the display panel, the viewing angle of the organic light-emitting unit, etc., so the value of the minimum non-interference distance L varies with the type of the display panel. The size of the organic light-emitting unit 120 may be considered in the calculation of the minimum non-interference distance L in other alternative embodiments and is not limited in the present disclosure.

As described above, the light emitted from the organic light-emitting unit 120 has an angular distribution, and the minimum non-interference distance L denotes the maximum radius of the coverage area 0132 formed by the light emitted from any organic light-emitting unit 120 and reflected by the first surface of the cover plate 40 onto the fingerprint recognition module 30. Apparently, the area defined by the reflected light of the light emitted at the maximum angle from the edge of the organic light-emitting angle 120 is the coverage area 0132, and the reflected light of the light emitted at any angle from the organic light-emitting angle 120 falls within the coverage area 0132.

Figure 13D:
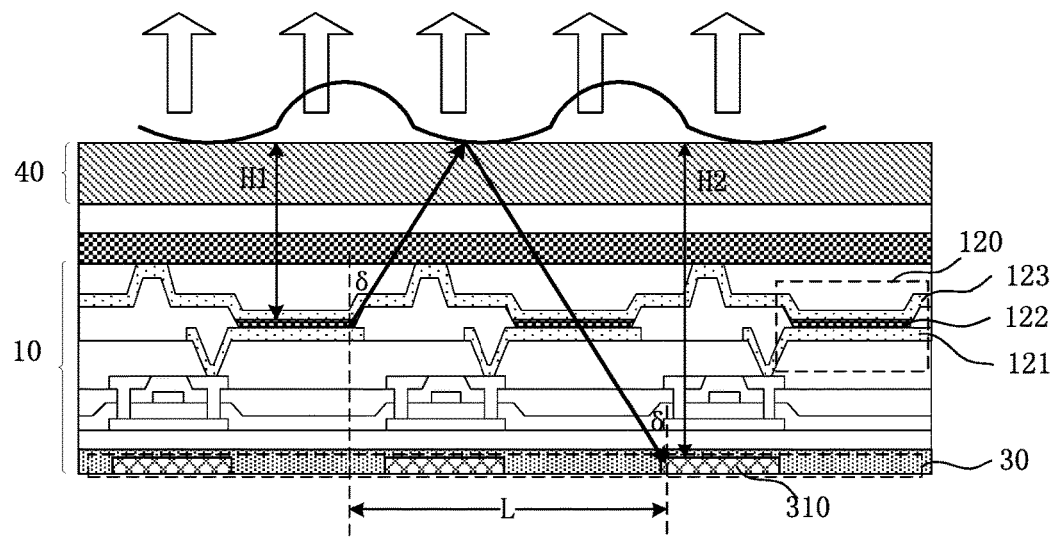
FIG. 13D is another cross sectional view of a display panel according to an embodiment of the present disclosure.

As shown in FIG. 13D, the light-emitting unit 120 in the present embodiment includes a first electrode 121, a light-emitting layer 122 and a second electrode 123. When signals are applied to the first electrode 121 and the second electrode 123, the light-emitting layer 122 emits light with an angular distribution. A fingerprint-reflected signal substantially belongs to specular reflection and a reflection angle is equal to an incidence angle, so the formula $L = \tan \delta \ast H_1 + \tan \delta \ast H_2$ applies. L is the minimum non-interference distance and $\delta$ is the included angle between the direction corresponding to the preset brightness of the organic light-emitting unit 120 and the direction perpendicular to the organic light-emitting layer. $H_1$ is the height, in the direction perpendicular to the display panel, from the first surface of the cover plate 40 to the light-emitting layer 122, and $H_2$ is the height, in the direction perpendicular to the display panel, from the first surface of the cover plate 40 to the fingerprint recognition module 30. The preset brightness is less than or equal to 10% of the brightness in the direction perpendicular to the light-emitting layer.

In the present embodiment, the angle of the light emitted from the organic light-emitting unit 120 is related to the brightness of the organic light-emitting unit 120, and the brightness is the subjective perception for the (achromatic) light intensity. In the present embodiment, the brightness in the direction perpendicular to the organic light-emitting unit 120 is defined as 100%. The lower the brightness percentage, the larger the corresponding viewing angle (included angle with the direction perpendicular to the light-emitting layer) and accordingly the weaker the light intensity. When the brightness of the organic light-emitting unit 120 is less than or equal to 10%, the intensity of the light emitted from the organic light-emitting unit 120 is weak, and the reflected light formed on the first surface of the cover plate 40 does not bring about interference to the fingerprint recognition unit 310. Therefore, the viewing angle of the organic light-emitting unit 120 is set to a critical value corresponding to 10% of the brightness in the direction perpendicular to the organic light-emitting unit 120 in the present embodiment. Based on this, the process of determining $\delta$ is: measuring the brightness in the direction perpendicular to the organic light-emitting unit 120, determining the position corresponding to 10% of the brightness in the direction perpendicular to the light-emitting layer, and then determining δ based on the included angle between the direction of this position and the direction perpendicular to the organic light-emitting layer. It is to be understood by those skilled in the art that the light intensity of each organic light-emitting unit and the preset brightness vary with the type of the display panel. For example, in other alternative embodiments, the preset brightness value may be optionally 12% or 9% of the brightness in the direction perpendicular to the organic light-emitting layer, and is not specifically limited in the present disclosure.

As shown in FIG. 13C which illustrates the scanning diagram of the display panel, in the fingerprint recognition stage, fingerprint recognition is performed on the display panel in a picture scanning mode. Specifically, multiple organic light-emitting units 120 are lighted simultaneously according to the first light-emitting dot matrix and sensing signals produced by the fingerprint recognition units 310 corresponding to the lighted organic light-emitting units 120 are recorded. In the next picture, organic light-emitting units 120 which are simultaneously lighted are displaced and the corresponding sensing signals are recorded until all organic light-emitting units 120 are lighted successively and fingerprint recognition is performed according to the obtained sensing signals of all fingerprint recognition units 310. Since the fingerprint recognition units 310 of the present embodiment do not receive interference signals, the fingerprint recognition precision of the present embodiment is high. It is to be understood by those skilled in the art that the first light-emitting dot matrix 0122 may be a minimum repetitive unit including multiple organic light-emitting units 120 that emit light simultaneously, and is not limited to a dot matrix formed by multiple organic light-emitting units 120 that emit light simultaneously.

In the display panel provided by the present embodiment, multiple organic light-emitting units emit light in the displacement manner according to the first light-emitting dot matrix in the fingerprint recognition stage. The distance between any two adjacent organic light-emitting units in the first light-emitting dot matrix is greater than or equal to the minimum non-interference distance. The minimum non-interference distance is the maximum radius of the coverage area formed by the light emitted from any organic light-emitting unit and reflected by the first surface of the cover plate onto the fingerprint recognition module. Apparently, the fingerprint-reflected light of any one of the organic light-emitting units emitting light in the first light-emitting dot matrix array illuminates the fingerprint recognition units corresponding to other organic light-emitting units that emit light at the same time. That is, the fingerprint recognition unit corresponding to any one of the organic light-emitting units in the first light-emitting dot matrix can receive only the fingerprint-reflected light of the corresponding organic light-emitting unit. Therefore, the fingerprint recognition unit does not receive interference signals of other organic light-emitting units. Accordingly, the fingerprint recognition circuit of the display panel performs fingerprint recognition according to the sensing signal produced by this fingerprint recognition unit, thus increasing the fingerprint recognition precision of the display panel.

It is to be noted that, to better explain the principle of the present embodiment, the present embodiment will be described with reference only to the display panel structure shown in FIG. 13A. The fingerprint recognition module in the display panel shown in FIG. 13A is disposed on a side, facing away from the cover plate, of the array substrate, and is not intended to limit the present disclosure. The present embodiment is further applicable to the display panel shown in any one of FIG. 1 to FIG. 7 and FIG. 11 to FIG. 12.

Figure 15A:
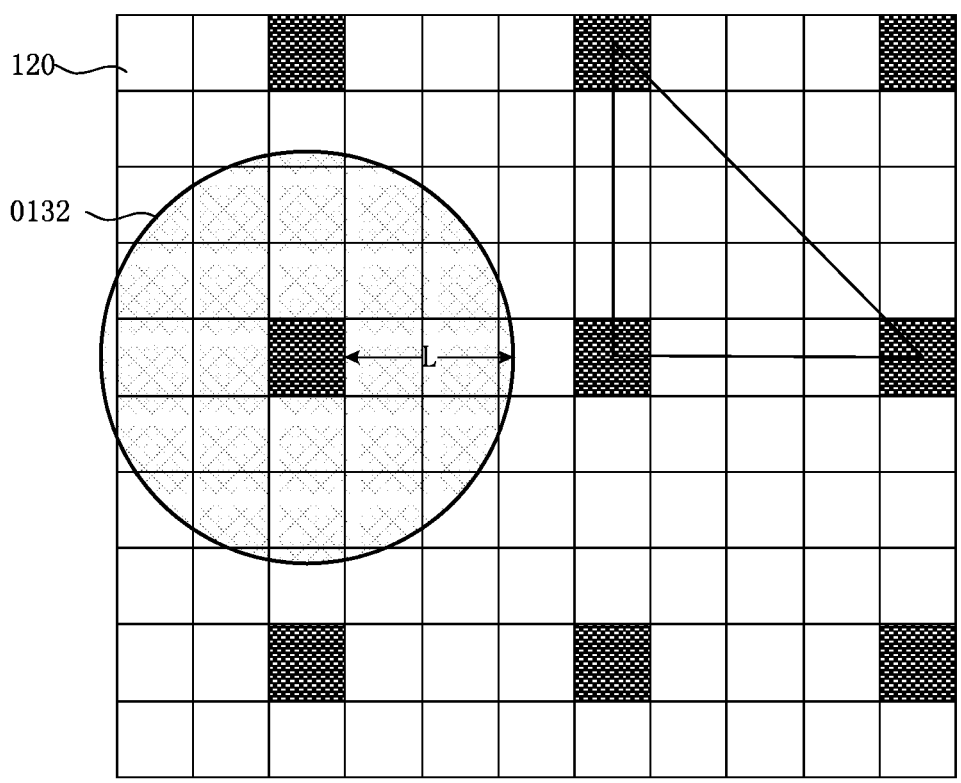
FIG. 15A is a top view of a part of the display panel according to an embodiment of the present disclosure.

It is to be noted that fingerprint information is read in the picture scanning mode by the display panel. In a frame of picture, multiple organic light-emitting units 120 emit light according to the first light-emitting dot matrix 0122 and the fingerprint information of the fingerprint recognition units 310 corresponding to the organic light-emitting units 120 emitting light is collected. In the next frame of picture, organic light-emitting units 120 which emit light are displaced. The organic light-emitting units 120 emitting light are displaced successively until all organic light-emitting units 120 are lighted via multiple frames of pictures. Apparently, the display panel reads fingerprint information via multiple frames of pictures. The more the number of organic light-emitting units 120 emitting light in one frame of picture, the more the number of frames of pictures are required for reading of all fingerprint information and the longer time is required for reading of all fingerprint information. For example, if the display panel reads fingerprint information using the picture scanning mode shown in FIG. 15A, i.e., the number of organic light-emitting units 120 which emit light simultaneously in one frame of picture (11*10 organic light-emitting units in all) is 9, then at least 12 frames of pictures need to be scanned for reading of fingerprint information of the fingerprint recognition units 310 corresponding to all organic light-emitting units 120. The time it takes to read fingerprint information is fixed in each frame of picture.

Figure 15B:
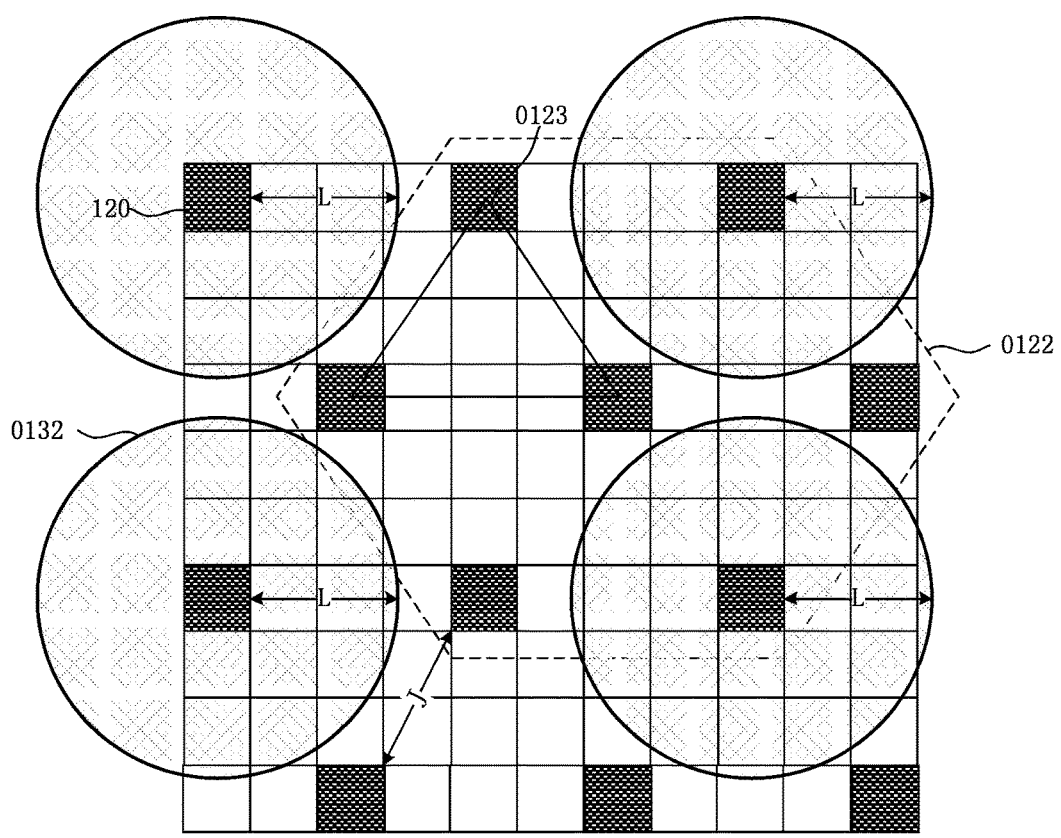
FIG. 15B is a top view of a fingerprint recognition stage scanning diagram of a display panel according to another embodiment of the present disclosure.

To reduce the time required to read fingerprint information, optionally, multiple organic light-emitting units 120 in the first light-emitting dot matrix 0122 shown in FIG. 15B constitute multiple patterns. In the multiple patterns shown in FIG. 15B, each angle of the smallest pattern 0123 is not equal to 90°. Apparently, in contrast to FIG. 15A, the distance J between two adjacent organic light-emitting units 120 emitting light in the first light-emitting dot matrix 0122 decreases, so the number of organic light-emitting units 120 emitting light in one frame of picture is larger. Specifically, the number of organic light-emitting units 120 emitting light simultaneously in one frame of picture (11*10 organic light-emitting units in all) is 12, so reading of fingerprint information of the fingerprint recognition units 310 corresponding to all organic light-emitting units 120 can be completed by scanning no more than 10 frames of pictures. Multiple organic light-emitting units 120 in the first light-emitting dot matrix 0122 constitute multiple patterns and each angle of the smallest pattern 0123 in the multiple patterns is not equal to 90°, thereby increasing the number of organic light-emitting units 120 emitting light simultaneously while ensuring no signal interference occurs and thus significantly decreasing the time required to read fingerprint information.

Figure 16A:
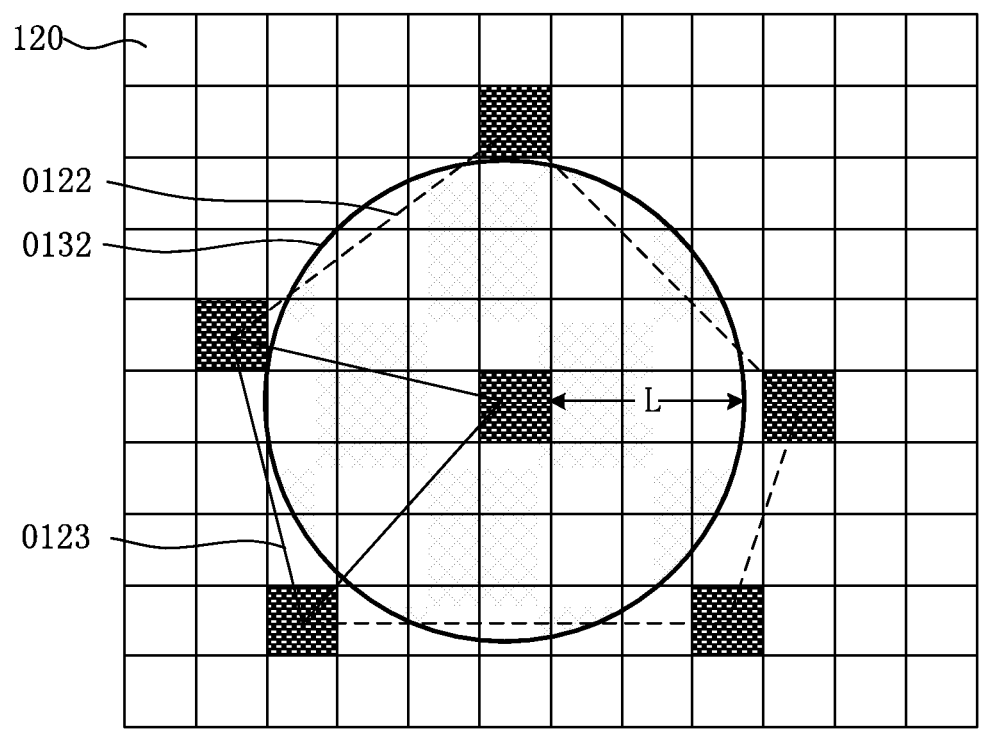
FIG. 16A is a schematic diagram of a first light-emitting dot matrix according to an embodiment of the present disclosure.

Exemplarily, based on the display panel described in any of the above embodiments, the first light-emitting dot matrix 0122 shown in FIG. 16A may be optionally a pentagonal light-emitting dot matrix, including a central organic light-emitting unit 120 and five edge organic light-emitting units 120. Multiple organic light-emitting units 120 in the first light-emitting dot matrix 0122 constitute multiple patterns and each angle of the smallest pattern 0123 in the multiple patterns is not equal to 90°. The pentagonal light-emitting dot matrix can increase the number of organic light-emitting units 120 which emit light simultaneously while ensuring no signal interference occurs and thus decrease the time required to read fingerprint information.

Figure 16B:
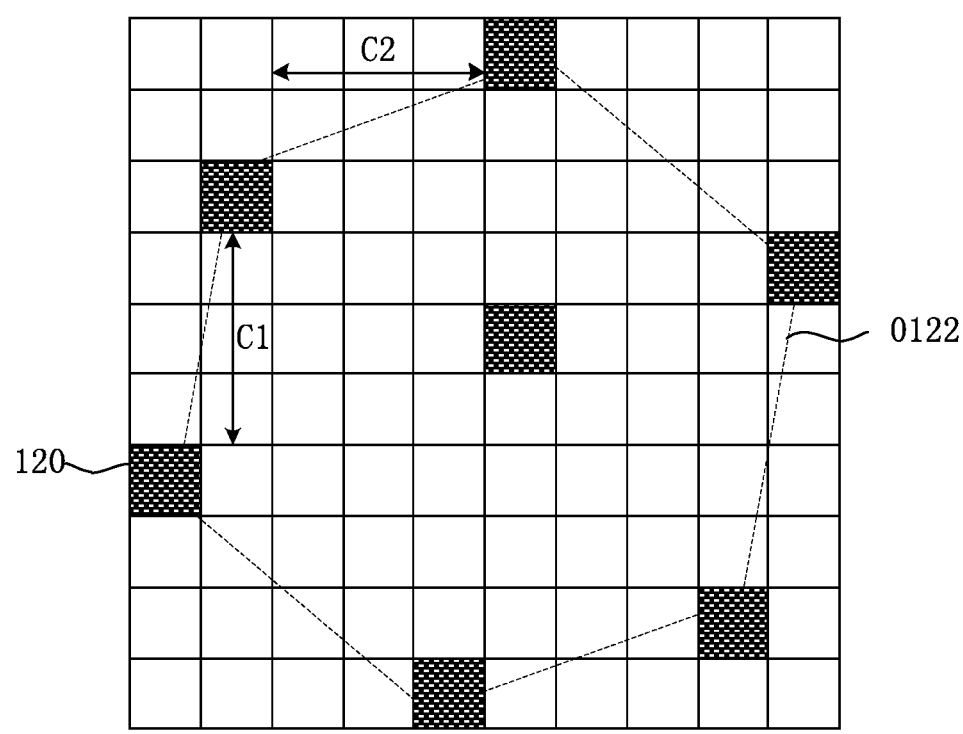
FIG. 16B is a schematic diagram of another first light-emitting dot matrix according to an embodiment of the present disclosure.

Exemplarily, based on the display panel described in any of the above embodiments, the first light-emitting dot matrix 0122 shown in FIG. 16B may be optionally a hexagonal light-emitting dot matrix, including a central organic light-emitting unit 120 and six edge organic light-emitting units 120. The hexagonal light-emitting dot matrix can increase the number of organic light-emitting units 120 which emit light simultaneously while ensuring no signal interference occurs and thus decrease the time required to read fingerprint information.

Figure 16C:
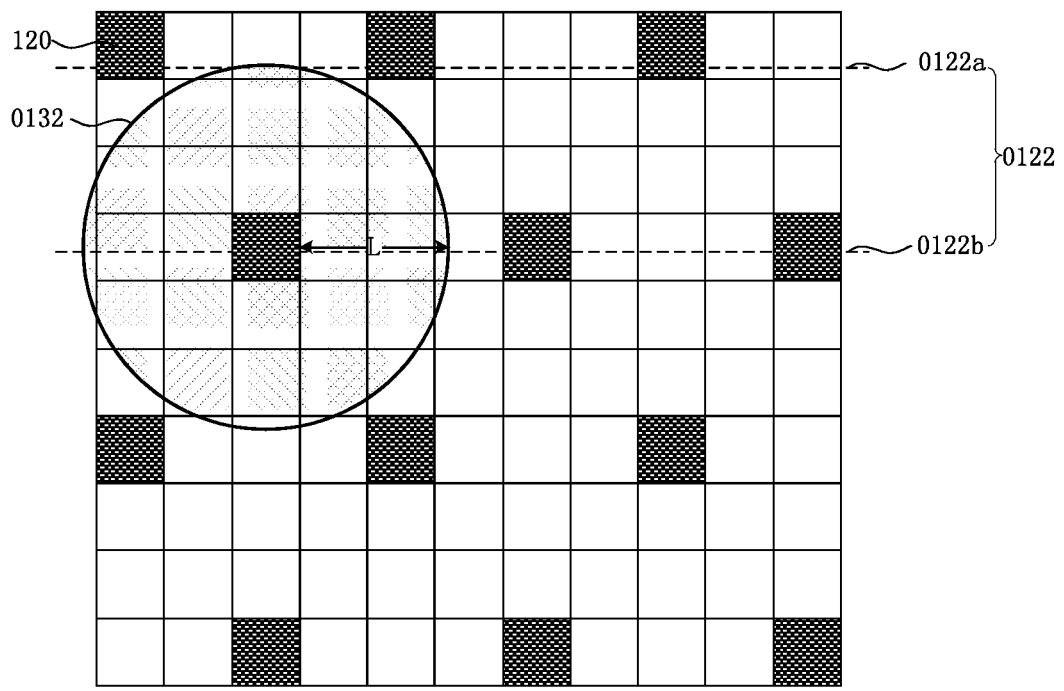
FIG. 16C is a schematic diagram of another first light-emitting dot matrix according to an embodiment of the present disclosure.

Exemplarily, based on the display panel described in any of the above embodiments, the first light-emitting dot matrix 0122 shown in FIG. 16C may be optionally composed of a first light-emitting row 0122*a* and a second light-emitting row 0122*b* which are not adjacent to each other. Specifically, any one of the organic light-emitting units 120 in the first light-emitting row 0122*a* and any one of the organic light-emitting units 120 in the second light-emitting row 0122*b* are disposed in different columns. In contrast to the scanning mode in FIG. 15A, any one of the organic light-emitting units 120 in the first light-emitting row 0122*a* and any one of the organic light-emitting units 120 in the second light-emitting row 0122*b* are disposed in different columns such that the number of organic light-emitting units 120 which emit light simultaneously is increased while ensuring no signal interference occurs. Specifically, the number of organic light-emitting units 120 which emit light simultaneously in one frame of picture (11×10 organic light-emitting units in all) is 12, so reading of fingerprint information of the fingerprint recognition units 310 corresponding to all organic light-emitting units 120 can be completed by scanning at most 10 frames of pictures, thereby significantly decreasing the time required to read fingerprint information.

Optionally, for any first light-emitting dot matrix 0122 in any one of the above embodiments, the distance J between any two adjacent organic light-emitting units 120 in the first light-emitting dot matrix 0122 is equal to the minimum non-interference distance L. Apparently, the fingerprint recognition unit 310 corresponding to any one of the organic light-emitting units 120 in the first light-emitting dot matrix 0122 does not receive interference signals from other organic light-emitting units which emit light simultaneously, thus ensuring the fingerprint signal precision. Meanwhile, when the distance J between any two adjacent organic light-emitting units 120 in the first light-emitting dot matrix 0122 is equal to the minimum non-interference distance L, the number of organic light-emitting units 120 which emit light simultaneously increases and the time required to read fingerprint signals decreases, i.e., the fingerprint reading efficiency increases.

Optionally, for any first light-emitting dot matrix 0122 in any one of the above embodiments, for any two adjacent organic light-emitting units 120 in different rows in the first light-emitting dot matrix 0122, the vertical distance C1 (as shown in FIG. 16B) between one light-emitting unit 120 and the row in which the other light-emitting unit 120 is located is less than the minimum non-interference distance L; and/or for any two adjacent organic light-emitting units 120 in different columns in the first light-emitting dot matrix 0122, the vertical distance C2 (as shown in FIG. 16B) between one light-emitting unit 120 and the column in which the other light-emitting unit 120 is located is less than the minimum non-interference distance L. The first light-emitting dot matrix 0122 ensures that the fingerprint recognition unit 310 corresponding to any one of the organic light-emitting units 120 in the first light-emitting dot matrix 0122 does not receive interference signals from other organic light-emitting units which emit light simultaneously, thus increasing the fingerprint signal precision. Meanwhile, thanks to the first light-emitting dot matrix 0122, the number of organic light-emitting units 120 which emit light simultaneously increases and the time required to read fingerprint signals decreases, i.e., the fingerprint reading efficiency increases.

A square array scanning mode and a hexagonal array scanning mode are used as examples to clearly describe the fingerprint reading efficiency of the display panel provided by the embodiment of the present disclosure. Interference can be avoided when the distance between adjacent organic light-emitting units 120 which are emitting light in the scanning picture is set to be at least a distance of 20 or more organic light-emitting units 120 (a distance between two centers of two organic light-emitting units). Specifically, the distance of 20 organic light-emitting units 120 is 20 P.

Figure 17A:
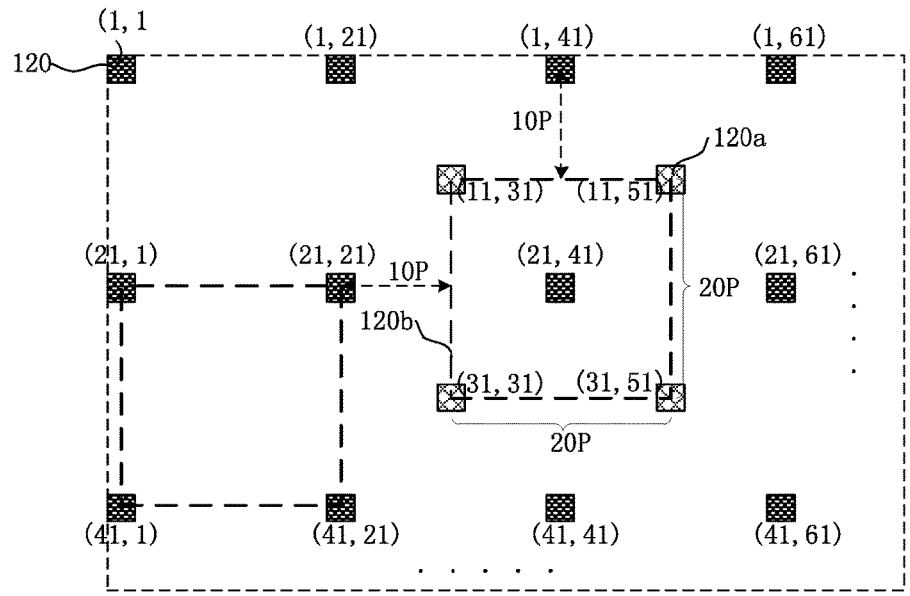
FIG. 17A is a schematic diagram illustrating a square array scanning mode of a display panel according to an embodiment of the present disclosure.

For the square array scanning mode shown in FIG. 17A, the coordinates of each organic light-emitting unit 120 emitting light are set to (row, column) and the coordinates of the first organic light-emitting unit 120 in the upper left corner are (1, 1). Thus, the coordinates of the organic light-emitting units 120 emitting light in the first row are (1, 1), (1, 21), (1, 41), . . . respectively, the coordinates of the organic light-emitting units 120 emitting light in the second row are (21, 1), (21, 21), (21, 41), . . . respectively, the coordinates of the organic light-emitting units 120 emitting light in the third row are (41, 1), (41, 21), (41, 41), . . . respectively, and so on. In this way, the coordinates of all organic light-emitting units 120 emitting light in one frame of picture are obtained. The display is divided vertically and horizontally into multiple identical illuminating areas 120*b* with each organic light-emitting unit 120 emitting light as a center point. Each illuminating area 120*b* has the same size. Each illuminating area 120*b* includes one organic light-emitting unit 120 which is emitting light and multiple organic light-emitting units 120*a* which are not emitting light surrounding the one organic light-emitting unit 120 emitting light. It is to be noted that the area corresponding to an organic light-emitting unit 120 emitting light at the edge of the display area is only part of the illuminating area of this organic light-emitting unit 120.

In the case that the organic light-emitting unit 120 (21, 41) is emitting light, the corresponding illuminating area 120*b* is defined by four organic light-emitting units 120*a* (11, 31), (11, 51), (31, 31) and (31, 51) which are not emitting light. Apparently, the length and the width of this illuminating area 120*b* are both 20 P, i.e., the number of the organic light-emitting units 120 constituting this illuminating area 120*b* is 20×20=400. However, only one organic light-emitting unit 120 (21, 41) is turned on in this illuminating area 120*b*, i.e., one organic light-emitting unit 120 is turned on among every 400 organic light-emitting units 120, so the density of organic light-emitting units 120 which are turned on of this illuminating area 120*b* is ¹⁄₄₀₀. The display area is divided into multiple illuminating areas 120*b*, so the density of organic light-emitting units 120 which are turned on in one frame of picture is ¹⁄₄₀₀. Thus, it is necessary to scan 20×20=400 frames to complete the luminescence of all the organic light-emitting units 120 in the display panel. FIG. 17A illustrates only part of organic light-emitting units 120 which are turned on simultaneously and their coordinates, and organic light-emitting units 120*a* which are turned off at four vertexes of an illuminating area 120*b* and their coordinates.

Figure 17B:
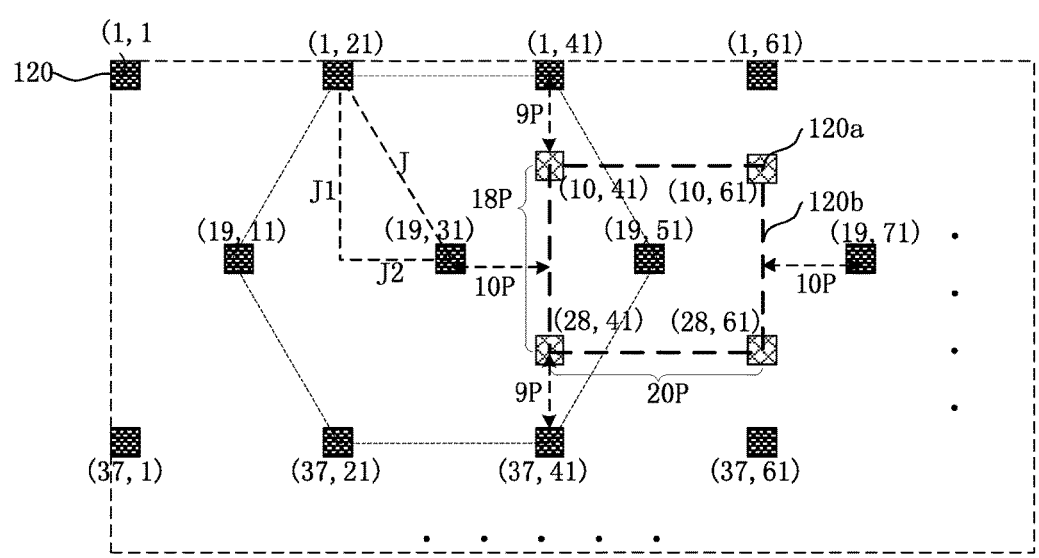
FIG. 17B is a schematic diagram illustrating a hexagonal array scanning mode of a display panel according to an embodiment of the present disclosure.

For the hexagonal array scanning mode shown in FIG. 17B, the coordinates of each organic light-emitting unit 120 which are emitting light are set to (row, column) and the coordinates of the first organic light-emitting unit 120 in the upper left corner are (1, 1). In the hexagonal array, the distance J between any two adjacent organic light-emitting units 120 which are emitting light reaches 20 organic light-emitting units 120 (20 P), the distance J1 between the row where the central organic light-emitting unit 120 is located and an edge organic light-emitting unit 120 in a row different from the row where the central organic light-emitting unit 120 is located reaches 10 P$\sqrt{3}$≈18 P, and the distance J2 between the column where the central organic light-emitting unit 120 is located and an edge organic light-emitting unit 120 in a row different from the row where the central organic light-emitting unit 120 is located reaches 10 P. Thus, the coordinates of the organic light-emitting units 120 emitting light in the first row are (1, 1), (1, 21), (1, 41), . . . , respectively. The coordinates of the organic light-emitting units 120 emitting light in the second row are (19, 11), (19, 31), (19, 51), . . . , respectively. The coordinates of the organic light-emitting units 120 emitting light in the third row are (37, 1), (37, 21), (37, 41), . . . , respectively, and so on. In this way, the coordinates of all organic light-emitting units 120 emitting light in one frame of picture are obtained. Apparently, when the organic light-emitting units 120 are turned on, in the case where the distance between any adjacent two organic light-emitting units 120 which are turned on at a same row remains 20 P, the distance between two adjacent rows where two light-emitting units 120 which are turned on are located respectively decreases to 18 P from 20 P. In this case, the distance between the central organic light-emitting unit 120 and an edge organic light-emitting unit 120 in a row different from the row where the central organic light-emitting unit 120 is located is $\sqrt{(10P)^2+(18P)^2}$≈20. 59 P>20 P, satisfying the requirements of avoiding interference.

The display area of the display panel is divided vertically and horizontally into multiple identical illuminating areas 120b with each illuminated organic light-emitting unit 120 as a center point. Each illuminating area 120b has the same size. Each illuminating area 120b includes an organic light-emitting unit 120 which is turned on and multiple organic light-emitting units 120a which are turned off surrounding the organic light-emitting unit 120 which is turned on. It is to be noted that the area corresponding to an organic light-emitting unit 120 which is turned on at the edge of the display area is only part of the illuminating area of this organic light-emitting unit 120.

In the case that the organic light-emitting unit 120 (19, 51) is turned on, the corresponding illuminating area 120b is defined by four surrounding organic light-emitting units 120a (10, 41), (10, 61), (28, 41) and (28, 61) which is not turned on. Apparently, the length, in the row direction, of this illuminating area 120b is 20 P and the length, in the column direction, of this illuminating area 120b is 18 P, i.e., the number of the organic light-emitting units 120 constituting this illuminating area 120b is 20×18=360. However, only one organic light-emitting unit 120 (19, 51) is turned on in this illuminating area 120b, i.e., one organic light-emitting unit 120 is illuminating among every 360 organic light-emitting units 120, so the density of organic light-emitting units 120 which are turned on of this illuminating area 120b is 1/360. The organic light-emitting layer 122 is divided into multiple illuminating areas 120b, so the density of organic light-emitting units 120 which are turned on in one frame of picture is 1/360. Thus, it is necessary to scan 20×18=360 frames to complete the luminescence of all the organic light-emitting units 120 in the display panel. FIG. 17B illustrates only part of organic light-emitting units 120 simultaneously turned on and their coordinates, and the organic light-emitting units 120a which are not turned on at four vertexes of an illuminating area 120b and their coordinates.

Apparently, the hexagonal array scanning mode shown in FIG. 17B is superior to the square matrix scanning mode shown in FIG. 17A.

Figure 18:
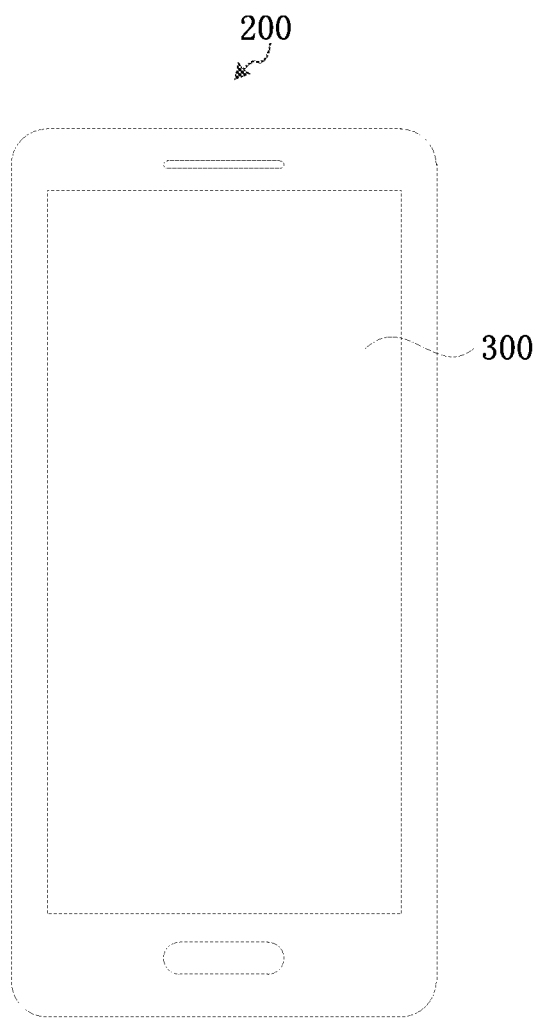
FIG. 18 shows the exterior of display device according to an embodiment of the present disclosure.

Another embodiment of the present disclosure provides a display device. FIG. 18 is a structure diagram of the display device according to an embodiment of the present disclosure. Referring to FIG. 18, the display device 200 includes the display panel 300 of any one of the embodiments of the present disclosure. The display panel 300 may be a mobile phone, a tablet PC, an intelligent wearable device, etc.

Figure 19:
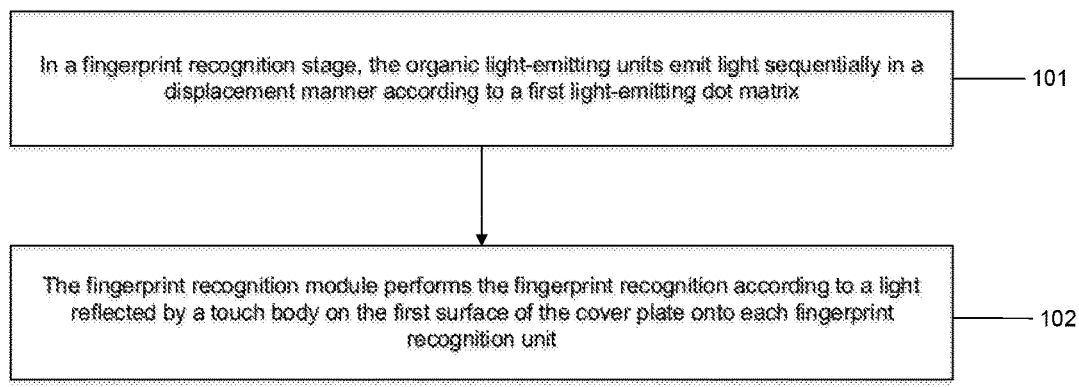
FIG. 19 is a flowchart illustrating a fingerprint recognition method of a display panel according to an embodiment of the present disclosure.

Another embodiment of the present disclosure provides a fingerprint recognition method of a display panel. The display panel is as shown in FIG. 1 to FIG. 7 and FIG. 11 to FIG. 16C. The display panel includes an array substrate 10, a fingerprint recognition module 30 and a cover plate 40. The array substrate 10 includes a first substrate 110 and a plurality of light-emitting units 120 on the first substrate 110. The organic light-emitting units 120 are disposed on a side, towards the cover plate 40, of the first substrate 110. The fingerprint recognition module 30 includes at least one fingerprint recognition unit 310. A first surface, facing away from the array substrate 10, of the cover plate 40 is a light-outgoing surface of the display panel. As shown in FIG. 19, the fingerprint recognition method of the present embodiment includes steps 101 and 102.

In step 101, in the fingerprint recognition stage, the organic light-emitting units emit light sequentially in a displacement manner according to a first light-emitting dot matrix. The distance between any two adjacent organic light-emitting units in the first light-emitting dot matrix is greater than or equal to the minimum non-interference distance. The minimum non-interference distance is the maximum radius of the coverage area formed by the light emitted from any organic light-emitting unit and reflected by the first surface of the cover plate onto the fingerprint recognition module.

In step 102, the fingerprint recognition module performs fingerprint recognition according to lights reflected by a touch body on the first surface of the cover plate onto each fingerprint recognition unit. In the present embodiment, the touch body may be a user's finger.

In the display panel provided by the present embodiment, the fingerprint recognition method is performed using a picture scanning mode and multiple organic light-emitting units emit light in the displacement manner according to the first light-emitting dot matrix. The distance between any two adjacent organic light-emitting units in the first light-emitting dot matrix is greater than or equal to the minimum non-interference distance, so the fingerprint-reflected light formed by light emitted from any one of the organic light-emitting units and then reflected by the fingerprint does not illuminate the fingerprint recognition units corresponding to other organic light-emitting units that emit light at the same time in the dot matrix. Therefore, the fingerprint recognition unit corresponding to any one of the organic light-emitting units in the first light-emitting dot matrix can receive only the fingerprint-reflected light formed by the light emitted from the corresponding organic light-emitting unit. That is, the fingerprint recognition unit does not receive interference signals of other organic light-emitting units. Accordingly, the sensing signal produced by the fingerprint recognition unit accurately represents the reflection of the outgoing light of the corresponding organic light-emitting unit onto the fingerprint of the user's finger. Therefore, the display panel provided by the present embodiment improves the fingerprint recognition precision.

It is to be noted that the above are only preferred embodiments of the present disclosure and the technical principles used therein. It will be understood by those skilled in the art that the present disclosure is not limited to the specific embodiments described herein. Those skilled in the art can make various apparent changes, modifications and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
   an array substrate, having a first substrate and a plurality of light-emitting units on the first substrate;
   an encapsulation layer, disposed on the plurality of light-emitting units; and
   a fingerprint recognition module, disposed on the encapsulation layer and comprising at least one fingerprint recognition unit;
   wherein a projection of the fingerprint recognition unit onto the array substrate is located within a non-light-emitting area of the first substrate, and the non-light-emitting area is located between two adjacent light-emitting units;
   wherein a horizontal distanced d between an edge of the fingerprint recognition unit and an edge of a closest light-emitting unit from the fingerprint recognition unit is greater than or equal to a preset distance so that the display panel has a viewing angle being greater than or equal to 50°;
   when the encapsulation layer is a transparent rigid cover plate and the fingerprint recognition module is disposed under the transparent rigid cover plate, the preset distance is $h*\tan\psi$;
   when the encapsulation layer is a thin film encapsulation layer and the fingerprint recognition module is disposed on a surface, facing away from the array substrate, of the thin film encapsulation layer, the preset distance is $$\frac{h*\sin\psi}{\sqrt{n_{TFE}^2 - \sin^2\psi}},$$

where $n_{TFE}$ is a refractive index of the thin film encapsulation layer; and
   wherein h represents a vertical distance from the fingerprint recognition unit to a light-exiting side of a light-emitting layer of the light-emitting unit, and ψ represents the viewing angle.

2. The display panel of claim 1, wherein
when the encapsulation layer is a transparent rigid cover plate, h=4 μm and d≥4.8 μm.

3. The display panel of claim 1, wherein
when the encapsulation layer is a thin film encapsulation layer, h=8 μm, $n_{TFE}$=1.5 and d≥4.7 μm.

4. The display panel of claim 1,
   wherein the fingerprint recognition module further includes a second substrate, and the at least one fingerprint recognition unit is disposed on the second substrate;
   wherein a surface, facing away from the fingerprint recognition unit, of the second substrate is attached by an adhesive layer to a surface, facing away from the array substrate, of the thin film encapsulation layer; and $$d = d1 + d2, \frac{n_{TFE}*d_1}{\sqrt{d_1^2 + h_1^2}} \geq \sin\psi \text{ and } \frac{n_{PI}*d_2}{\sqrt{d_2^2 + h_2^2}} \geq \sin\psi$$

apply, wherein
   $n_{TFE}$ represents a refractive index of the thin film encapsulation layer, $h_1$ represents a distance from an interface between the thin film encapsulation layer and the adhesive layer to a light-outgoing side of a light-emitting layer of the light-emitting unit, d represents the horizontal distance between an edge of the fingerprint recognition unit and an edge of a closest one of the plurality of light-emitting units to the fingerprint recognition unit, and ψ represents the viewing angle, and $d_1$ represents a horizontal distance to an edge of a light-emitting area from an outgoing point of a light, which is emitted from the edge of the light-emitting area of the light-emitting unit, on an interface between the thin film encapsulation layer and the adhesive layer, and $n_{PI}$ represents a refractive index of the second substrate, $h_2$ represents a sum of a thickness of the adhesive layer and a thickness of the second substrate, and d2 represents a horizontal distance to an edge of the fingerprint recognition unit from the outgoing point of light, which is emitted from the edge of the light-emitting area of the light-emitting unit, on the interface between the thin film encapsulation layer and the adhesive layer.

5. The display panel of claim 4, wherein
$h_1$=8 μm, $n_{TFE}$=1.5, $h_2$=10 μm, $n_{PI}$=1.6 and d≥10.1 μm.

6. The display panel of claim 1,
   wherein the light-emitting unit comprises a first electrode, a light-emitting layer, and a second electrode, and the light-emitting layer is disposed between the first electrode and the second electrode;
   wherein the array substrate further comprises a pixel defining layer, the pixel defining layer has a plurality of opening areas, and the light-emitting layer of the light-emitting unit is disposed in the plurality of opening areas;
   wherein the second electrode covers the light-emitting layer and a non-opening area of the pixel defining layer; and
   wherein the projection of the fingerprint recognition unit onto the array substrate is located in the non-opening area of the pixel defining layer.

7. The display panel of claim 1, wherein the fingerprint recognition unit comprises a photosensitive diode, a storage capacitor and a thin film transistor;
   wherein an anode of the photosensitive diode is electrically connected to a first electrode of the storage capacitor, and a cathode of the photosensitive diode is electrically connected to a second electrode of the storage capacitor and to a source electrode of the thin film transistor;

wherein a gate electrode of the thin film transistor is electrically connected to a switch control line, and a drain electrode of the thin film transistor is electrically connected to a signal detection line;

wherein the photosensitive diode is used for converting light reflected by a touch body into a current signal; and wherein in a fingerprint recognition stage, the thin film transistor is turned on and the current signal is transmitted by the thin film transistor to the signal detection line such that fingerprint recognition is performed according to the current signal.

8. The display panel of claim 1,
wherein the light-emitting unit provides a light source for the fingerprint recognition module; and
wherein the light emitted from the light-emitting unit is reflected by a touch body onto the fingerprint recognition unit such that fingerprint recognition is performed.

9. The display panel of claim 1, further comprising: a fingerprint recognition light source,
wherein the fingerprint recognition light source is located on a side, facing away from the fingerprint recognition module, of the light-emitting unit; and
wherein a light emitted from the fingerprint recognition light source is reflected by a touch body onto the fingerprint recognition unit such that fingerprint recognition is performed.

10. The display panel of claim 1, further comprising: a touch electrode, wherein
the fingerprint recognition module and the touch electrode are disposed on opposite surfaces of the encapsulation layer.

11. The display panel of claim 1, further comprising: a touch electrode, wherein
the fingerprint recognition module and the touch electrode are disposed on a surface at a same side of the encapsulation layer.

12. A display device, comprising: a display panel comprising:
an array substrate, having a first substrate and a plurality of light-emitting units on the first substrate;
an encapsulation layer, disposed on a side, facing away from the first substrate, of the plurality of light-emitting units; and
a fingerprint recognition module disposed on the encapsulation layer and comprising at least one fingerprint recognition unit, wherein
a projection of the fingerprint recognition unit onto the array substrate is located within a non-light-emitting area of the first substrate, and the non-light-emitting area is located between two adjacent light-emitting units; and a horizontal distanced d between an edge of the fingerprint recognition unit and an edge of a closest light-emitting unit from the fingerprint recognition unit is greater than or equal to a preset distance so that the display panel has a viewing angle being greater than or equal to 50°;
when the encapsulation layer is a transparent rigid cover plate and the fingerprint recognition module is disposed under the transparent rigid cover plate, the preset distance is h*tan ψ; and
when the encapsulation layer is a thin film encapsulation layer and the fingerprint recognition module is disposed on a surface, facing away from the array substrate, of the thin film encapsulation layer, then the preset distance is $$\frac{h*\sin\psi}{\sqrt{n_{TFE}^2 - \sin^2\psi}},$$

where $n_{TFE}$ is a refractive index of the thin film encapsulation layer;
wherein h represents a vertical distance from the fingerprint recognition unit to a light-exiting side of a light-emitting layer of the light-emitting unit, and w represents the viewing angle.

13. The display device of claim 12, wherein when the encapsulation layer is a transparent rigid cover plate, then h=4 μm and d≥4.8 μm.

14. The display panel of claim 12, wherein when the encapsulation layer is a thin film encapsulation layer, then h=8 μm, $n_{TFE}$=1.5 and d≥4.7 μm.

* * * * *